(12) United States Patent
Gutierrez et al.

(10) Patent No.: US 10,976,793 B2
(45) Date of Patent: Apr. 13, 2021

(54) MASS STORAGE DEVICE ELECTRICAL POWER CONSUMPTION MONITORING

(71) Applicant: Amazon Technologies, Inc., Seattle, WA (US)

(72) Inventors: Felipe Enrique Ortega Gutierrez, Tacoma, WA (US); Jason Alexander Harland, Seattle, WA (US); Roey Rivnay, Seattle, WA (US); David Edward Bryan, Seattle, WA (US); Christopher Strickland Beall, Woodinville, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/739,810

(22) Filed: Jan. 10, 2020

(65) Prior Publication Data

US 2020/0150733 A1  May 14, 2020

Related U.S. Application Data

(63) Continuation of application No. 14/643,983, filed on Mar. 10, 2015, now Pat. No. 10,534,417.

(51) Int. Cl.
*G06F 1/28* (2006.01)
*H05K 7/14* (2006.01)

(52) U.S. Cl.
CPC ............. *G06F 1/28* (2013.01); *H05K 7/1494* (2013.01)

(58) Field of Classification Search
CPC .......... G06F 1/206; G06F 3/0647; G06F 1/28; H05K 7/1494
See application file for complete search history.

(56) References Cited

U.S. PATENT DOCUMENTS 5,566,317 A  10/1996  Treiber et al.
6,785,827 B2  8/2004  Layton et al.
(Continued)

OTHER PUBLICATIONS

Ou et al, EDM: An Endurance-Aware Data Migration Scheme for Load Balancing in SSD Storage Clusters, 2014 IEEE 28th International Parallel and Distributed Processing Symposium, Phoenix, AZ, 2014, pp. 787-796. (Year: 2014).*

(Continued)

*Primary Examiner* — Mark A Connolly
(74) *Attorney, Agent, or Firm* — Robert C. Kowert; Kowert, Hood, Munyon, Rankin & Goetzel, P.C.

(57) ABSTRACT

A rack computer system can provide data indicating electrical power consumption by separate sets of the mass storage devices, including separate individual mass storage devices, of the rack computer system. A power sensor can be electrically coupled to a power transmission line for each mass storage device. The power sensor can be coupled to the power transmission line externally to the mass storage device. The power sensor can be an internal power sensor of the mass storage device, where a mass storage device microcontroller transmits internally-generated data to an external power monitoring system. A microcontroller can transmit the data to a baseboard management controller via a side-band connection between the mass storage device and the controller. The data can be transmitted via an in-band connection between a baseboard management controller and an instance of firmware which accesses internally-generated data from mass storage device microcontrollers.

20 Claims, 11 Drawing Sheets

(56) References Cited

U.S. PATENT DOCUMENTS

| | | | |
|---|---|---|---|
| 7,003,623 B2 | 2/2006 | Teng | |
| 7,131,014 B2 | 10/2006 | Suzuki et al. | |
| 7,526,671 B2 | 4/2009 | Kawamoto et al. | |
| 8,516,089 B2 | 8/2013 | Johnsen et al. | |
| 9,772,788 B1 | 9/2017 | Beall et al. | |
| 10,534,417 B1 | 1/2020 | Gutierrez et al. | |
| 2006/0264178 A1 | 11/2006 | Noble et al. | |
| 2007/0019320 A1 | 1/2007 | Cho | |
| 2008/0037164 A1 | 2/2008 | Oh et al. | |
| 2008/0115010 A1* | 5/2008 | Rothman | G06F 9/5094 714/10 |
| 2011/0072293 A1 | 3/2011 | Mazzaferri et al. | |
| 2015/0193154 A1* | 7/2015 | Gong | G06F 3/0608 711/103 |
| 2016/0062421 A1* | 3/2016 | Sugawara | G05B 15/02 700/299 |
| 2017/0168532 A1* | 6/2017 | Kim | G06F 1/206 |
| 2017/0269652 A1* | 9/2017 | Lee | G06F 1/206 |

OTHER PUBLICATIONS

Industry Perspectives on Jun. 26, 2012, "Debunking Data Center Power Myths", downloaded from http://www.datacenterknowledge.com/archives/2012/06/26/debunkingdatacenterpowermyths/, pp. 1-4.
ABB Decathlon (TM), "Data center infrastructure management—Operation intelligence for agile business", From URL: www.abb.com/datacenters/decathlon, 2013, pp. 1-8.
U.S. Appl. No. 15/197,570, filed Jun. 29, 2016, Peter George Ross, et al.

\* cited by examiner

MASS STORAGE DEVICE ELECTRICAL POWER CONSUMPTION MONITORING

This application is a continuation of U.S. patent application Ser. No. 14/643,983, filed Mar. 10, 2015, which is hereby incorporated by reference herein in its entirety.

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Because a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 110V). A network of cabling, bus bars, power connectors, and power distribution units, is used to deliver the power at the lower voltage to numerous specific components in the facility.

Because a computing facility may contain a large number of servers, a large amount of infrastructure may be required to support computing capacity of the data center. In particular, a large amount of cabling infrastructure equipment, electrical distribution infrastructure equipment, network communication infrastructure equipment, air cooling infrastructure equipment, etc. may be required to support computing operations by servers in a data center at any given time. Some instances of infrastructure are usually installed at initial construction of a data center, based at least in part upon design assumptions regarding the support requirements of server racks (also referred to herein as "rack computer systems") that are expected to be installed in the data center.

Some servers include a number of components that are mounted in an interior of the server. The components, which can include printed circuit boards (for example, a motherboard) and mass storage devices, can support one or more components that generate waste heat, referred to herein as "heat-producing components". For example, a motherboard can support a central processing unit, and mass storage devices can include hard disk drives which include motors and electronic components that generate heat. Some or all of this heat must be removed from the components to maintain continuous operation of a server. The amount of heat generated by the central processing units, hard disk drives, etc. within a data room may be substantial. Heat may be removed from the heat-producing components via an airflow flowing through a server.

Figure 1:
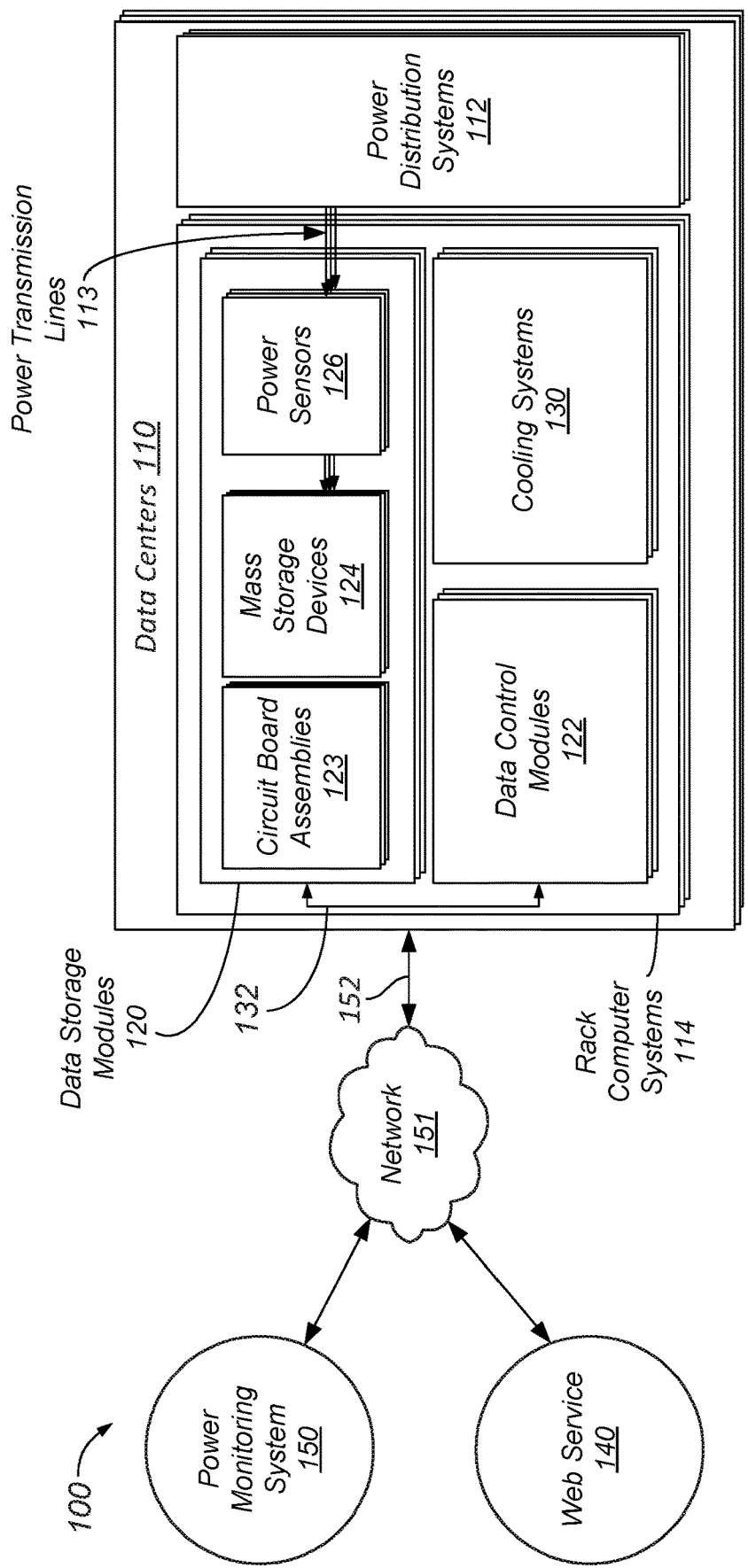
FIG. 1 is a schematic diagram illustrating a system which includes a set of data centers which perform computing operations for a web service and a power monitoring system which manages various aspects of the system based on electrical power consumption by mass storage devices in the data centers, according to some embodiments.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of systems, apparatuses and methods for monitoring electrical power consumption by mass storage devices installed in one or more rack computer systems, in one or more data centers, are disclosed.

According to one embodiment, a data center includes multiple rack computer systems and a power monitoring system which monitors individual electrical power consumption by the mass storage devices included in the rack computer systems. Each mass storage device is coupled to at least one power distribution system and consumes electrical power supplied by the at least one power distribution system. Each rack computer system includes power sensors, where each power sensor is electrically coupled to a separate corresponding mass storage device and generates measurement data indicating electrical power consumption by the corresponding mass storage device.

According to one embodiment, an apparatus includes a rack computer system, which includes multiple mass storage devices and generates power data indicating electrical power consumption by each of multiple limited selections of the mass storage devices. The rack computer system includes multiple power sensors, where each power sensor generates power data indicating electrical power consumption by a separate limited selection of the mass storage devices.

According to one embodiment, a method includes configuring a rack computer system to generate power data for each set, of a plurality of sets, of mass storage devices comprised in the rack computer system. Such configuring includes electrically coupling separate power sensors to separate sets of power transmission lines in the rack computer system, wherein each set of power transmission lines supplies electrical power to a separate corresponding set of mass storage devices, such that each power sensor is configured to generate power data indicating electrical power consumption by the corresponding set of mass storage devices.

As used herein, "computing" includes any operations that can be performed by a computer, such as computation, data storage, data retrieval, or communications.

As used herein, "computer room" means a room of a building in which computer systems, such as rack-mounted servers, are operated.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers and other systems and components dedicated to specific functions (e.g., e-commerce transactions, database management) or serving multiple functions. Examples of computer operations include information processing, communications, simulations, and operational control.

As used herein, "room", "hall", etc. means a room, space, enclosure, etc. of a structure. A "computer room" means a room in which computer systems, such as rack-mounted servers, are operated.

As used herein, a "space", "enclosure", etc. means a space, area or volume.

As used herein, a "module" is a component or a combination of components physically coupled to one another. A module may include functional elements and systems, such as computer systems, racks, blowers, ducts, power distribution units, fire suppression systems, and control systems, as well as structural elements, such a frame, housing, structure, container, etc. In some embodiments, a module is pre-fabricated at a location off-site from a data center.

In some embodiments, a rack computer system includes one or more data storage modules, comprising one or more sets of mass storage devices, wherein the data storage modules provide data indicating electrical power consumption by each separate set of mass storage devices. In some embodiments, each set of mass storage devices comprises a single mass storage device, such that a data storage module provides data indicating individual electrical power consumption by each separate mass storage device included in the data storage module.

In some embodiments, a data storage module which can provide data indicating electrical power consumption by separate sets of mass storage devices included therein includes multiple power sensors, where each power sensor is electrically coupled to a separate set of one or more power transmission lines which supply electrical power to a separate set of mass storage devices. As a result, each power sensor is configured to measure electrical power consumption by a separate set of mass storage devices. As referred to herein, a mass storage device or set of mass storage devices for which a given power sensor monitors electrical power consumption is a "corresponding" mass storage device or set of mass storage devices with respect to the given power sensor. Such a corresponding mass storage device or set of mass storage devices can be understood to be "monitored" by the given power sensor.

A power sensor which measures electrical power consumption by a set of mass storage devices can, in some embodiments, generate data, referred to herein interchangeably as "power data", "measurement data", etc. which indicates the measured electrical power consumption of the set of mass storage devices. The generated power data can be transmitted, via one or more communication links, to a power monitoring system. The power monitoring system can monitor electrical power consumption by each of various sets of mass storage devices included in one or more data storage modules, rack computer systems, and data centers.

Based on the power data generated by multiple power sensors included in a data storage module, the power monitoring system can monitor electrical power consumption at a higher level of granularity than would be possible via simply monitoring total electrical power consumption by the data storage module, or the rack computer system in which one or more data storage modules are installed. As a result, the power monitoring system can adjust various aspects of data center operations, also referred to herein as operating states of one or more components which support computing operations performed in one or more rack computer systems in one or more data centers, based on monitoring electrical power consumption by separate sets of mass storage devices.

In some embodiments, an operating temperature of one or more mass storage devices can be determined based at least in part upon the determined electrical power consumption by the one or more mass storage devices. A relationship between electrical power consumption and operating temperature can be associated with one or more mass storage devices, based at least in part upon tracking variations over time in electrical power consumption and operating temperature of at least one example set of mass storage devices, and the relationship can be associated with various mass storage devices determined to have one or more determined similar properties, including a determined common manufacturer, model, quantity, etc. relative to the example set of mass storage devices. As a result, based at least in part upon the determined relationship associated with a given set of mass storage devices, an operating temperature of the set can be determined based on power data, generated by a power sensor, which indicates electrical power consumption by the set of mass storage devices.

In some embodiments, a power monitoring system can adjust one or more components which support computing operations in one or more rack computer systems, in one or more data centers. Components which support such computing operations can refer to components which provide one or more various instances of support which enable the computing operations to be performed by one or more components, including data control modules, mass storage devices, etc. of one or more rack computer systems. Such components can refer to components, which can include components which implement one or more services, the services themselves, etc. which control which manage data migration, computing operation assignments, etc. with regard to various mass storage devices. Such components can include components which provide one or more various instances of infrastructure support, including electrical power support, cooling support, etc. For example, a component which supports computing operations in a rack computer system can include a cooling system, included in the rack, which induces cooling of one or more components in the rack so that the one or more components do not overheat, which could restrict or terminate computing operation performance in the rack. In another example, a component which supports computing operations in a rack computer system can include a power distribution system which supplies electrical power to one or more various components in the rack. In another example, a component which supports computing operations includes one or more components, in the rack computer system, which manage the performance of computing operations by one or more components in the rack. Components, in the rack computer system, which manage the performance of computing operations by one or more components in the rack can include a microcontroller, in a mass storage device, which controls the rate at which computing operations are performed by one or more components of the mass storage device, the rate at which computing operations are performed in the mass storage device, etc. Components, in the rack computer system, which manage the performance of computing operations by one or more components in the rack can include a data control module which controls the rate at which computing operations are performed by one or more components of one or more mass storage devices in a rack, the rate at which computing operations are performed in the one or more mass storage devices, etc.

In some embodiments, adjusting a component which supports computing operations in one or more racks includes adjusting one or more operating states of the component. Adjusting an operating state can include adjusting a state of operation of the component, such that the output provided by the component which supports computing operations is adjusted. For example, where the component is a cooling system which provides cooling of one or more components, adjusting an operating state of the cooling system can include adjusting the amount of cooling, rate of cooling, etc. induced by the cooling system. Where the component manages the rate at which computing operations are performed, adjusting an operating state of the component can include adjusting the rate at which computing operations are performed, as controlled by the component. Where the component manages data migrations between various mass storage devices, adjusting an operating state of the component can include adjusting restricting, encouraging, etc. data migration to, from, etc. one or more particular mass storage devices. Adjusting an operating state of a component can include generating a command which, when transmitted to the component, cause the component to implement the adjustment to the operating state of the component. Such a command can include a command signal, electrical signal, etc. The command can include a command to a particular portion of a component, including a motor, actuator, instance of processing circuitry, etc.

In some embodiments, a power monitoring system can adjust cooling of one or more particular sets of mass storage devices, via adjusting one or more operating states of one or more cooling systems in a data center, based on monitoring electrical power consumption by the one or more mass storage devices. The power monitoring system can adjust cooling of different sets of mass storage devices differently, based on different electrical power consumption by the different sets. As a result, mass storage device cooling can be tailored to the specific conditions of specific mass storage devices, thereby resulting in more efficient distribution of resources, such as electrical power, to implement cooling of mass storage devices. Such more efficient resource distribution can result in lowered operational costs associated with a data center.

In some embodiments, a power monitoring system can adjust data migration between one or more particular sets of mass storage devices, via communication with one or more particular web services which manage data migration between various mass storage devices, based on monitoring electrical power consumption by the one or more mass storage devices. The power monitoring system can at least partially restrict data migrations to various particular sets of mass storage devices based on determinations that the present operating temperatures of the set of mass storage devices at least meets a certain threshold amount. Restricting data migrations to a mass storage device which has at least a certain operating temperature can reduce the likelihood of the operating temperature of the mass storage device exceeding a maximum operating temperature, referred to herein as an occurrence of "overheating" of the mass storage device, which can lead to damage of the device and can result in lost data or computing operations. Thus, operational and maintenance costs with regard to mitigating thermal damage to mass storage devices can be reduced by managing data migrations to reduce the occurrences of overheating in a data center, thereby reducing the frequency of mass storage devices being taken offline, replaced, repaired, etc. due to thermal damage caused by overheating.

In some embodiments, adjusting data migration between one or more particular sets of mass storage devices includes commanding data migration away from a given set of mass storage devices, based on a determination that the operating temperature of the set of mass storage devices exceeds a particular threshold. Such commanded data migrations away from the set of mass storage devices can result in reduced activity at the set of mass storage devices, which can further result in reduced operating temperatures and reduced probability of overheating of the set of mass storage devices.

In some embodiments, a power monitoring system can adjust activity on a set of mass storage devices. Activity on a set of mass storage devices can include a rate at which computing operations are performed on the set of mass storage devices, an amount of data stored on the mass storage devices, etc. Such adjustment can include managing the amount of data stored in a given set of mass storage devices, managing the rate at which computing operations are performed on the set of mass storage devices, etc. Such management, which can be implemented based at least in part upon commands generated at the power monitoring system and sent to the set of mass storage devices, can result in reduced activity at the set of mass storage devices, which can further result in reduced operating temperatures and reduced probability of overheating of the set of mass storage devices.

As referred to herein, monitoring, adjustments, etc. which can be implemented with regard to a set of mass storage devices can be implemented with regard to an individual mass storage device. Similarly, as referred to herein, monitoring, adjustments, etc. which can be implemented with regard to an individual mass storage device can be implemented with regard to a set of mass storage devices.

In some embodiments, a power monitoring system can adjust a data center design associated with a data center to be constructed in the future. The data center design can include specifications for various aspects of a further data center, including power distribution system support capacity specifications, cooling system capacity specifications, etc. Based on monitoring electrical power consumption by various sets of mass storage devices in one or more presently-existing data centers, the power monitoring system can adjust various specifications included in the data center design to reduce excess design margins, resulting in the future data center, upon construction, having closer operating margins which more closely conform to actual operational requirements, thereby resulting in reduced unneeded expenditure of capital and operational resources. For example, the cooling capacity specification for rack cooling systems in a data center design can be adjusted to specify less cooling capacity in each rack computer system, based at least in part upon a determination that the cooling of mass storage devices in a presently-existing data center, determined based on monitoring electrical power consumption of the mass storage devices, does not exceed more than a certain proportion of the previously-established cooling capacity. In another example, a data center design can be adjusted to include a reduced power support capacity specification for a power distribution system for a computer room based at least in part upon a determination that electrical power consumption by mass storage devices in a presently-existing computer room does not, within a certain probability and confidence level, exceed a certain amount.

FIG. 1 is a schematic diagram illustrating a system which includes a set of data centers which perform computing operations for a web service and a power monitoring system which manages various aspects of the system based on electrical power consumption by mass storage devices in the data centers, according to some embodiments.

System 100 includes a set of data centers 110 which can be located at one or more various physical locations. A data center 110 can include a set of power distribution systems 112 which can supply electrical power to various sets of components included in the data center 110. Such components can include one or more rack computer systems, cooling systems, network communication devices, etc. As referred to herein, supplying electrical power to a component can be referred to as providing electrical power support to the component. A power distribution system 112 can include one or more various power distribution components, including one or more uninterruptible power supplies (UPSs), power distribution units (PDUs), transformers, automatic transfer switches (ATSs), switching devices, switchgear, circuit breakers, etc.

A power distribution system 112 can receive electrical power from one or more various power feeds, including one or more utility power sources, generators, batteries, etc. In some embodiments, a power distribution system includes one or more instances of infrastructure 113 which can carry electrical power supplied by the power distribution system to one or more various components included in a data center. Such instances of infrastructure 113, as shown in FIG. 1, can be referred to herein as instances of power line infrastructure, and can include one or more instances of power busways, bus bars, power transmission lines, power cables, some combination thereof, or the like.

In some embodiments, one or more instances of power line infrastructure 113 is included within one or more of the components and distributes electrical power received at the component to one or more various sub-components included within the component. For example, a rack computer system included in a data center can include one or more power transmission lines which are electrically coupled to a power inlet interface of the rack computer system and are further electrically coupled to one or more mass storage devices, controller devices, etc. within the rack computer system, such that the one or more power transmission lines in the rack computer system are configured to supply electrical power from a power distribution system to the one or more mass storage devices, controller devices, etc.

Data center 110 includes one or more rack computer systems 114, also referred to herein as "server racks", "racks", or the like. A rack computer system can include one or more data storage modules 120, one or more data control modules 122, and one or more cooling systems 130. In some embodiments, a rack includes various network communication components, including one or more network switching devices, one or more console switching devices, etc.

A data control module 122 can include control circuit board assemblies, and a data storage module 120 can include backplane circuit board assemblies 123 and mass storage devices 124, each of which may include one or more heat producing components. In some embodiments, a data control module 122 is included within a data storage module 120. In some embodiments, a data control module 122 includes one or more instances of an intelligent platform management interface (IPMI), including one or more instances of a baseboard management controller (BMC). In some embodiments, a cooling system 130 includes one or more air moving devices which can induce an airflow through one or more of the modules 120, 122 in the rack 114 to remove heat from the heat producing components. In some embodiments, a cooling system 130 includes a fluid circulation system, heat exchanger, etc. which circulates a coolant fluid, via one or more conduits, through one or more portions of a rack 114, where the circulated fluid removes heat from one or more portions of the rack.

In some embodiments, a rack computer system 114 includes one or more data storage modules 120 that are accessed from, and controlled by, a data control module 122. The data control module 122, in some embodiments, is external to the data storage modules 120. In some embodiments, a data control module and one or more data storage modules coupled to the data control module are included within a common rack computer system.

Each data storage module 120 can include a chassis, to which one or more circuit board assemblies 123 are coupled. Each data storage module can include a set of mass storage devices 124 which are coupled to one or more circuit board assemblies 123. Mass storage devices 124 in data storage modules 120 can be communicatively coupled to data control module 122 via connections between the mass storage devices 124 and the one or more circuit board assemblies 123 to which the mass storage devices 124 are coupled. Data control module 122 may access data on any or all of the mass storage devices 124 in one or more of the data storage modules 120. In some embodiments, data control module 122 is mounted in an interior of one or more of the data storage modules 120.

In various embodiments, a data storage module 120 includes two or more circuit boards 123, each of which carry, and provide electrical connections for, multiple mass storage devices 124. In some embodiments, one or more of the circuit boards in a data storage module comprises a backplane which can support one or more coupled mass storage devices 124. Backplanes may provide power, data, and signal connections for mass storage devices 124. In some embodiments, one or more portions of a backplane are coupled with a mass storage device to provide at least some structural load support of the mass storage device in the data storage module. In various embodiments, each of mass storage devices 124 is a hard disk drive. In one embodiment, each of mass storage devices 124 is a 4 TB hard disk drive with a Serial Advance Technology Attachment (SATA) interface.

Rack 114 includes one or more communication links 132 between the mass storage devices 124 of the data storage modules 120 and the data control module 122. Each link 132 may include one or more cables between data control module 122 and one or more various data storage modules 120. Each link 132 may provide a connection for data input/output between data control module 122 and one of the data storage modules. In some embodiments, each link 132 may provide for data I/O on multiple channels (for example, four channels). Each of data storage modules 120 may be assigned a separate identifier. In some embodiments, a link 132 includes a side-band connection which enables sideband communication between a portion of a data storage module 120, including a mass storage device 124, and a data control module 122.

In some embodiments, a data control module 122 includes one or more instances of firmware, including a Basic Input/Output System (BIOS). The data control module can, in some embodiments, include a memory device which stores an operating system.

In some embodiments, a data control module 122 includes one or more baseboard management controllers. In some embodiments, one or more components included in a data storage module, including a mass storage device, power sensor, etc. is configured to communicate signals to the data control module 122. Such signals can include data signals, electrical signals passed through an electrical circuit, some combination thereof, etc.

Each data storage module 120 includes a set of power sensors 126. Power sensors 126 are each coupled to a separate set of power transmission lines 113 in the data storage module, where each set of power transmission lines 113 is configured to supply electrical power to a separate set of mass storage devices 124 within the given data storage module 120, such that a given power sensor 126 is configured to measure electrical power consumption by a separate set of mass storage devices 124. A set of mass storage devices can include a separate limited selection of the mass storage devices 124 included in a data storage module 120, including an individual mass storage device 124. A power sensor 126 can be coupled to a power transmission line 113 external to a set of mass storage devices 124. For example, power sensors 126 can be coupled to separate power transmission lines 113 in a backplane, where each separate power transmission line 113 is configured to supply electrical power to a separate mass storage device 124 coupled to the backplane at a separate position, so that each power sensor 126 can measure electrical power consumption by a separate one of the mass storage devices 124. In some embodiments, a power sensor is configured to selectively monitor power consumption by a separate one or more mass storage devices of a set of mass storage devices to which the power sensor is coupled. For example, a power sensor can be configured to switch between monitoring power consumption by separate mass storage devices.

In some embodiments, one or more power sensors 126 are included within one or more mass storage devices 124 as internal power sensors of said mass storage devices 124. Such an internal power sensor can be electrically coupled to a power transmission line which is internal to the mass storage device 124 and is configured to supply electrical power to one or more internal components of the mass storage device 124, including a microcontroller of the mass storage device. As a result, a mass storage device 124 which includes an internal power sensor 126 is configured to generate power data indicating electrical power consumption by that mass storage device 124.

Cooling systems 130 can include one or more air moving devices which can be adjustably controlled to adjustably induce air flow through one or more data storage modules 120, data control modules 122, etc. at one or more air flow rates, thereby providing adjustable cooling of various heat-generating components included therein. Air flow through a data storage module, data control module, etc. can remove heat from one or more heat-generating components of the respective modules, including components of one or more mass storage devices. Air moving devices, as referred to herein, can include one or more fans, blowers, etc.

System 100 includes a power monitoring system 150 which can be implemented on one or more computer systems. System 150 is communicatively coupled to one or more portions of the racks 112 in the data centers 110 via one or more communication networks 151 and can receive power data, generated by power sensors 126 in one or more data storage modules 120, indicating electrical power consumption by one or more mass storage devices 124 in the modules 120. Based on receiving said power data, system 150 can monitor electrical power consumption by various individual sets of mass storage devices 124 in one or more data centers 110. In some embodiments, where received power data indicates electrical power consumption by one or more individual mass storage devices 124, system 150 can monitor electrical power consumption by individual mass storage devices 124.

A web service 140, which can be implemented on one or more computer systems, including one or more computer systems included in one or more of the data centers 110, and can be communicatively coupled to one or more portions of a rack 112, including a data control module 122, one or more mass storage devices 124, etc., via one or more communication networks 151. A web service can manage various computing operations performed on various racks, including managing data storage in various mass storage devices included in the various racks. Web service 140, in some embodiments, can manage data migration between various racks included in various data centers 110, data storage in one or more various rack computer systems, computing operation performance on one or more various rack computer systems, etc.

In some embodiments, power monitoring system 150 adjusts one or more operating states of one or more components which support computing operations performed in one or more data centers 110 based on power data indicating electrical power consumption by one or more sets of mass storage devices 124 in the one or more data centers 110. Such adjustment can include system 150 adjusting, via command signals communicated over network 151, an amount of cooling of the one or more sets of mass storage devices by one or more particular cooling systems 130. For example, system 150 can adjust an induced air flow rate of an air moving device included in a particular cooling system 130 to cause the system 130 to provide increased cooling of one or more particular mass storage devices 124, based at least in part upon a determination, based on processing received power data generated by one or more power sensors 126, that an operating temperature of the particular mass storage devices 124 at least meets a threshold operating temperature. The operating temperature can be determined based on a predetermined relationship, between electrical power consumption and operating temperature, which is associated with the one or more particular mass storage devices.

In some embodiments, system 150 communicates with the web service 140, via one or more communication networks 151, to command the service 140 to restrict data migration to selected mass storage devices 124, migrate data away from one or more selected mass storage devices 124, etc. to cause the operating temperature of the devices 124 to be reduced, to prevent the operating temperature from exceeding a threshold, some combination thereof, etc. In some embodiments, system 150 can communicate with one or more portions of one or more data control modules 122, mass storage devices 124, etc. to command adjustments to amounts of data stored in one or more devices 124, adjustments to the rate of computing operation performance by one or more devices 124, etc. to cause the operating temperature of the devices 124 to be reduced, to prevent the operating temperature from exceeding a threshold, some combination thereof, etc.

In some embodiments, system 150 maintains a data center design, based upon which future data centers are constructed, and system 150 adjusts various specifications which specify various structural parameters of various data center components, also referred to interchangeably herein as "components", in the design, including specifications of structural parameters of one or more power distribution systems, rack computer systems, cooling systems, mass storage devices, etc. based on power data received from mass storage devices 124 included in the presently-existing data centers 110.

Figure 2:
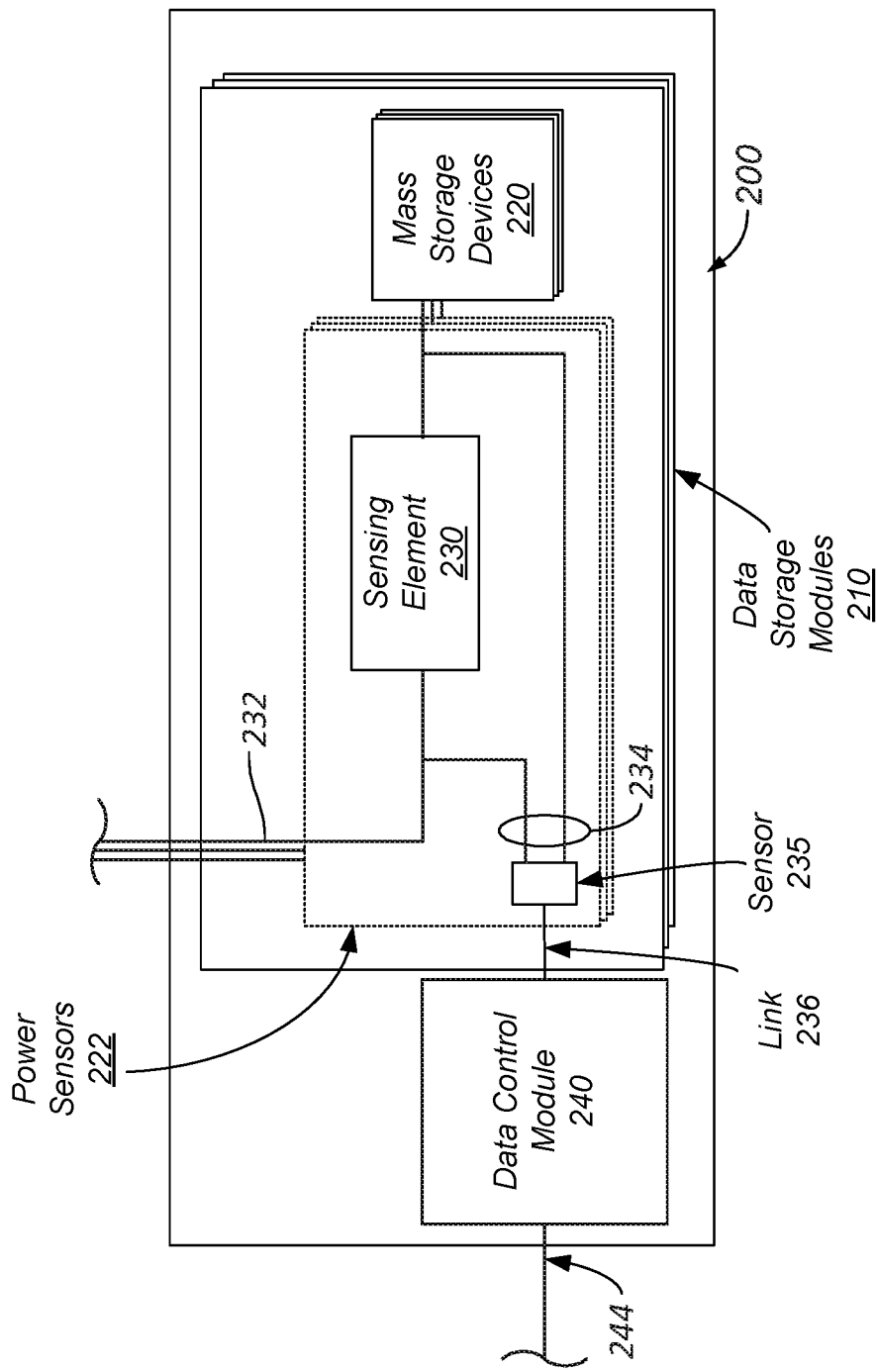
FIG. 2 is a schematic diagram illustrating a rack computer system which includes a data control module and multiple data storage modules which include mass storage devices and externally-coupled power sensors which measure electrical power consumption by the mass storage devices, according to some embodiments.

FIG. 2 is a schematic diagram illustrating a rack computer system which includes a data control module and multiple data storage modules which include mass storage devices and externally-coupled power sensors which measure electrical power consumption by the mass storage devices, according to some embodiments. The rack computer system 200 illustrated in FIG. 2 can be included in any of the embodiments included herein.

In some embodiments, a rack computer system includes one or more data storage modules which include power sensors which are electrically coupled to separate sets of mass storage devices externally to said mass storage devices. Separate power sensors can be coupled to separate sets of power transmission lines, which can include one or more power transmission lines which are configured to supply electrical power to separate corresponding sets of one or more mass storage devices.

A power sensor coupled to a power transmission line externally to a corresponding mass storage device can be configured to measure the flow of electricity through the power transmission line to measure electrical power consumption by the corresponding mass storage device. A power sensor can include a sensing element and a sensing circuit, where the sensing element is coupled in series with the power transmission line and causes an electrical signal to pass through the sensing circuit, where the electrical signal can be processed to determine the electrical power being consumed via the power transmission line. In some embodiments, a sensing element includes one or more of an electrical resistor, sense resistor, point of load devices, some combination thereof, etc. and a sensing circuit includes an electrical circuit which is coupled to the power transmission line in parallel with the sensing element. In some embodiments, a sensing element includes a point of load D-to-D device.

In some embodiments, the electrical signal is an electrical current having particular properties associated with the electrical power consumption through the power transmission line and an electrical resistance of the sensing element. For example, where the sensing element is an electrical resistor having a predetermined electrical resistance, and an electrical current having a particular strength is measured in the parallel sensing circuit, the electrical power consumption by the corresponding mass storage devices can be determined based on the current strength and the electrical resistance. In some embodiments, the power sensor includes an electrical sensor device which is coupled to the sensing circuit and measures one or more properties of electrical power in the sensing circuit, including electrical current, voltage, etc. In some embodiments, the sensing circuit is coupled to another device which detects one or more properties of electrical power in the sensing circuit and generates power data based on the detected properties.

As a result of coupling a power sensor to one or more power transmission lines externally to one or more corresponding mass storage devices, the power sensor can be used to measure electrical power consumption by various conventional mass storage devices without modifying the mass storage devices.

In the illustrated embodiment of FIG. 2, rack computer system 200 includes a set of data storage modules 210 and a data control module 240, where the data control module is communicatively coupled to a communication network via an external communication link 244. Each data storage module 210 includes a set of mass storage devices 220 and a set of power transmission lines 232 which carry electrical power supplied to the rack 200 by a power distribution system which is located externally to the rack 200. In some embodiments, each power transmission line 232 in the set can be referred to as a "branch" or "leg" of the power distribution system which supplies the electrical power, where each branch supplies electrical power to a separate set of mass storage devices 220.

As shown, each data storage module 210 includes a set of power sensors 222 which are each configured to measure electrical power consumption by a separate set of mass storage devices 220. As shown, each power sensor 222 is coupled to a separate power transmission line 232 externally to a corresponding mass storage device 220. A power sensor 222 shown in FIG. 2 includes a sensing element 230 which is coupled in series with the power transmission line 232, and a sensing circuit 234 which is coupled to the line 232 in parallel with the sensing element 234. As further shown, an electrical sensor 235 is coupled to the sensing circuit 234 and is configured to measure one or more electrical properties of the circuit 234, including electrical current strength. For example, sensor 235 can configured to detect electrical current strength of a current through circuit 234, a voltage difference between the points the circuit 234 coupled to the line 232, some combination thereof, etc. In some embodiments, power sensor 222 includes a sensor 235 coupled directly to line 232, and element 230 and circuit 234 are absent from sensor 222.

As further shown, sensor 235 is electrically coupled to the data control module 240 via an electrical link 236. In some embodiments, the sensor 235 is included in the data control module 240, and module 240 is coupled to the sensing circuit 234, so that the module 240 can detect one or more electrical properties of the circuit 234 and generate power data indicating electrical power consumption by the one or more corresponding mass storage devices based at least in part upon the detected electrical properties.

In an example of power sensor 222 generating power data indicating electrical power consumption by a corresponding mass storage device 210, sensor 222 can include a sensing element 230 which is an electrical resistor having a particular predetermined electrical resistance and a sensor 235 which is an ammeter and, upon the corresponding mass storage device 220 consuming electrical power via a line 232, a portion of the power is redirected through the parallel sensing circuit 234, where the ammeter 235 detects the current strength through the ammeter and relays the detected current strength to the control module 240 which determines, based on the detected current strength through circuit 234 and the predetermined electrical resistance of resistor 230, the amount of electrical power being consumed by the corresponding mass storage device 220. The determined electrical power consumption can be used by module 240 to generate power data which indicates the electrical power consumption, and the data can be transmitted to an externally located system, which can include a power monitoring system, through link 244.

In some embodiments, the power sensor includes a temperature sensor device, including a thermocouple, which is included within a data storage module and is configured to measure the present operating temperature of one or more mass storage devices and communicate the measurements, as generated data, to a power monitoring system.

Figure 3:
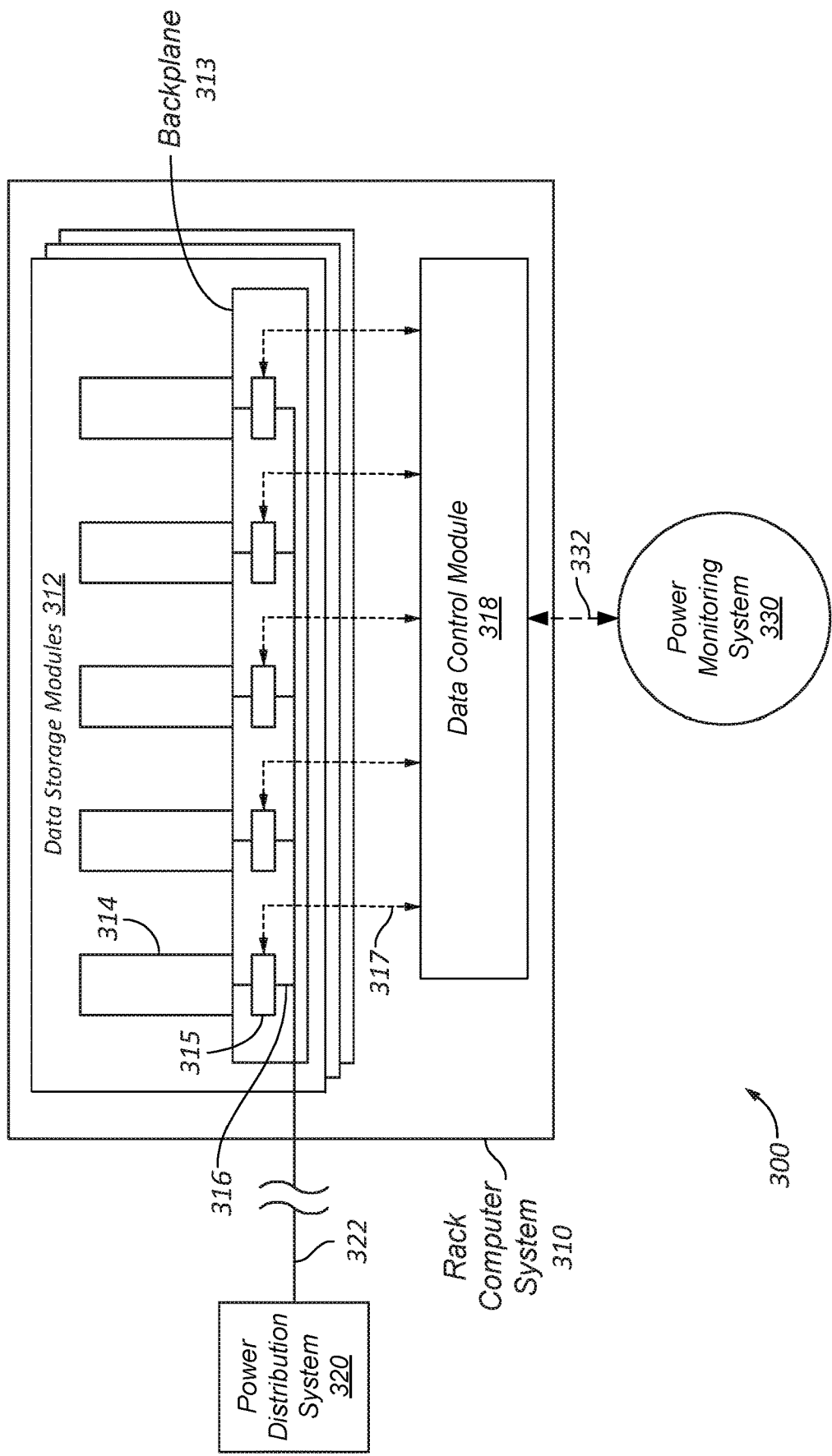
FIG. 3 is a schematic diagram illustrating a rack computer system which includes a data control module and multiple data storage modules which include mass storage devices and externally-coupled power sensors which measure electrical power consumption by the mass storage devices, according to some embodiments.

FIG. 3 is a schematic diagram illustrating a rack computer system which includes a data control module and multiple data storage modules which include mass storage devices and externally-coupled power sensors which measure electrical power consumption by the mass storage devices, according to some embodiments. The rack computer system 300 can be included in any of the embodiments included herein.

System 300 includes a rack computer system 310 which is electrically coupled to a power distribution system 320 via a power transmission line 322 and is communicatively coupled to a power monitoring system 330 via a communication link 332. As shown, each rack computer system 310 includes a data control module 318 and a set of data storage modules 312. Each data storage module 312 includes a set of mass storage devices 314 coupled to a backplane 313, where the backplane can incorporate a circuit board assembly. The data storage modules 312 can each include a chassis to which one or more backplanes 313 are coupled, such that a mass storage device 314 coupled to a backplane 313 is coupled to a data storage module 312.

Backplane 313 includes a set of power transmission lines 316 which each receive electrical power from the power distribution system 320 via line 322 between system 320 and rack 310. Such lines 316 can be referred to as "branching" from the line 322 to the various coupled mass storage devices 314. As shown, each line 316 can supply electrical power to a separate mass storage device 314 coupled to the backplane 313. As further shown, the lines 316 can be included in the backplane 313.

Each data storage module 312 includes a set of power sensors 315 which are each electrically coupled to a separate power transmission line 316 and are therefore each configured to measure electrical power consumption by a separate corresponding mass storage device 314 via the respective line 316. Each sensor 315 can generate one or more instances of power data indicating the electrical power consumption by the corresponding mass storage device 314.

Data control module 318 is communicatively coupled, via one or more communication links 317, to each of the power sensors 315. Each power sensor 315 can transmit generated power data to module 318 via a respective link 317. Module 318 can communicate the power data generated by the various power sensors 315 to power monitoring system 330 via one or more communication links 332. In some embodiments, one or more of the sensors 315 or module 318 at least partially process power data generated by the sensors. Such processing can include converting the generated data into a separate format which is readable by one or more computer-executable programs, adding one or more instances of metadata to the power data, where such metadata can include one or more of a timestamp indicating a time at which the power data was generated, a mass storage device identified identifying the particular mass storage device 314 for which the power data indicates electrical power consumption, etc.

Figure 4:
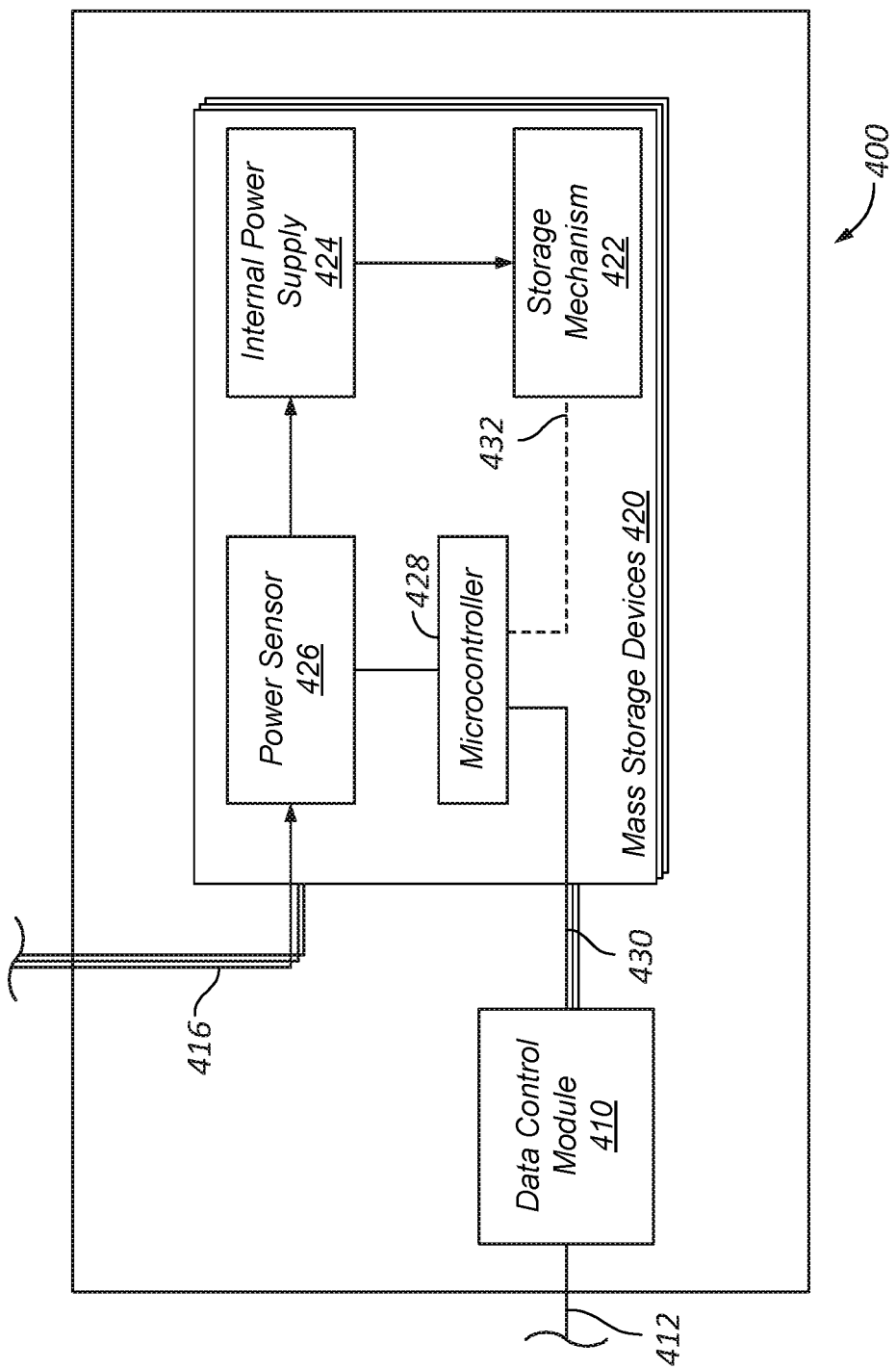
FIG. 4 is a schematic diagram illustrating a rack computer system which includes a data control module and a data storage module which includes mass storage devices which can provide internally-generated power data to the data control module via a side-band communication link, according to some embodiments.

FIG. 4 is a schematic diagram illustrating a rack computer system which includes a data control module and a data storage module which includes mass storage devices which can provide internally-generated power data to the data control module via a side-band communication link, according to some embodiments. The rack computer system 400 can be included in any of the embodiments included herein.

In some embodiments, a power sensor which measures electrical power consumption by a mass storage device, and generates power data indicating the electrical power consumption by the corresponding mass storage device, is included within the corresponding mass storage device as an internal power sensor. The power sensor can be communicatively coupled with a microcontroller of the mass storage device. The microcontroller can be configured to control various computing operations, data access operations, etc. performed by the mass storage device. In addition, the microcontroller can at least partially process power data generated by an internal power sensor, where such data can be referred to as internally-generated power data. Such processing can include converting the generated data into a separate format which is readable by one or more programs, adding one or more instances of metadata to the power data, where such metadata can include one or more of a timestamp indicating a time at which the power data was generated, a mass storage device identifier identifying the particular mass storage device for which the power data indicates electrical power consumption, etc.

In some embodiments, the microcontroller is configured to transmit internally-generated power data to one or more systems, services, etc. located external to the mass storage device, including one or more data control modules, controller devices, power monitoring systems, etc.

In the illustrated embodiment, rack computer system 400 includes a set of data storage modules 411 and a data control module 410. In some embodiments, the data control module 410 is included in one or more of the data storage modules 411. In some embodiments, the data control module includes a baseboard management controller. In some embodiments, the data control module includes one or more instances of firmware which are communicatively coupled to the microcontroller 428 via one or more communication links 430.

Each data storage module 411 includes a set of mass storage devices 420. Each mass storage device includes a storage mechanism 422, an internal power supply mechanism 424, and a microcontroller 428. The microcontroller 428 can be communicatively coupled to the storage mechanism 422 via a link 432 and can control various computing operations with regard to mechanism 422, including data access operations, performance of computing operations by device 420, some combination thereof, etc.

As shown, each mass storage device 420 includes a power sensor 426 which is electrically coupled to a power transmission line 416 which supplies electrical power to the mass storage device 420. The power sensor 426 is an internal sensor of the mass storage device 420, as the sensor 426 is included within the mass storage device 420 and is coupled to an internal power transmission line included within the mass storage device 420. As a result, the sensor 426 can measure electrical power consumption by the mass storage device 420 based at least in part upon electrical power consumed via the line 416. In some embodiments, power sensor 426 includes a sensing element, including one or more of a resistor, point of load device, etc., and microcontroller 428 is configured to determine the amount of electrical power supplied to supply 424, and thus consumed by device 420, based on a current through a parallel circuit to which the microcontroller is coupled and predetermined characteristics of the sensing element.

As shown, sensor 426 is communicatively coupled to the microcontroller 428. In some embodiments, the microcontroller 428 is a secondary microcontroller in the mass storage device 420, where another separate microcontroller in the device 420 is configured to control data access operations with regard to device 422, performance of computing operations by device 420, some combination thereof, etc. The microcontroller 428 can receive power data generated by the sensor 426. The sensor 426 can include one or more various power sensors, including one or more of a sense resistor, a point of load device, etc. In some embodiments, the microcontroller 428 is electrically coupled to the line 416 in parallel with a sensor 426 which comprises an electrical resistor, and the microcontroller can determine the electrical power consumption by the device 420 based at least in part upon determining a strength of the electrical current through the parallel circuit and based in part upon determining the electrical resistance of the resistor.

In some embodiments, the microcontroller 428 transmits internally-generated power data to one or more externally-located systems. Such transmitting can include transmitting at least some of the internally-generated power data to a data control module via a side-band communication link between the mass storage device 420 and the control module 410. In some embodiments, for example, mass storage device 420 includes a communication interface which is configured to communicate data to control module 410 via a side-band communication link 430, and the device 420 can include a side-band communication interface which is configured to communicate side-band signals via the link 430. The microcontroller can be configured to transmit at least some internally-generated power data via side-band communication. In some embodiments, microcontroller 428 converts power data generated by sensor 426 into firmware-readable pages which are processed by an instance of firmware included in the data control module 410, via a side-band link 430 between module 410 and microcontroller 428, where module 410 can transmit the processed power data to a power monitoring system via a communication link 412.

As a result, in some embodiments, a mass storage device can transmit power data via side-band communication, leaving in-band communication links available for communicating other data, including data migration to and from a mass storage device. In some embodiments, side-band communication between a mass storage device microcontroller and a data control module includes communication via an I²C interface, or the like.

Figure 5:
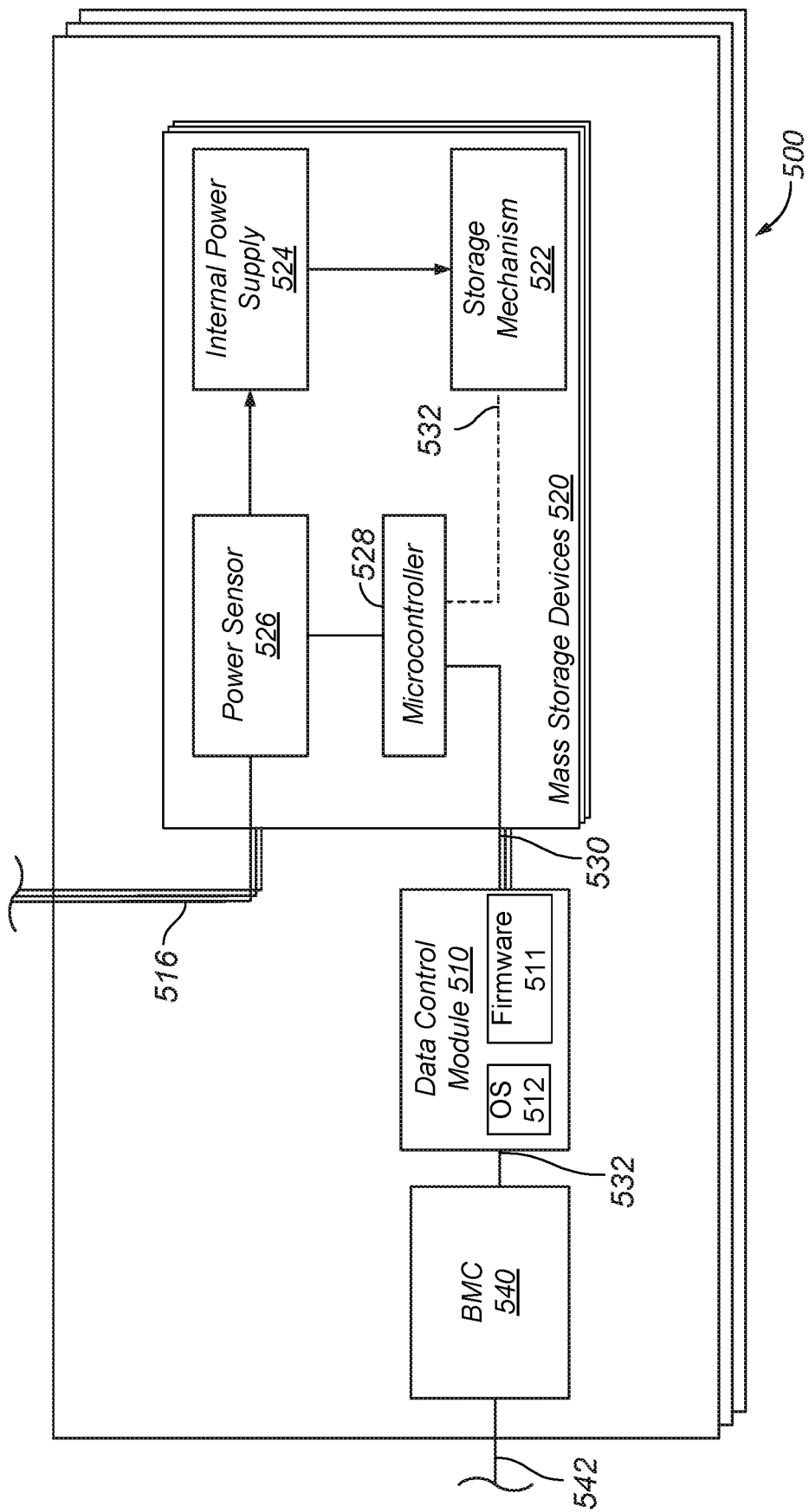
FIG. 5 is a schematic diagram illustrating a rack computer system which includes a data control module and a data storage module which includes mass storage devices which can provide internally-generated power data to the data control module via an in-band communication link, according to some embodiments.

FIG. 5 is a schematic diagram illustrating a rack computer system which includes a data control module and a data storage module which includes mass storage devices which can provide internally-generated power data to the data control module via an in-band communication link, according to some embodiments. The rack computer system 500 can be included in any of the embodiments included herein.

In some embodiments, the microcontroller is configured to transmit internally-generated power data to one or more systems, services, etc. located external to the mass storage device, including one or more data control module, controller devices, power monitoring systems, etc. via in-band communication with a data control module. The in-band communication can include in-band communication by an operating system, in-band communication by an instance of firmware, some combination thereof, etc.

In the illustrated embodiment, rack computer system 500 includes a set of mass storage devices 520. Each mass storage device includes a storage mechanism 522, an internal power supply 524, and a microcontroller 528. The microcontroller can be communicatively coupled with mechanism 522 via link 532, and can control data access operations with regard to mechanism 522, performance of computing operations by device 520, some combination thereof, etc.

As shown, each mass storage device 520 includes a power sensor 526 which is electrically coupled to a power transmission line 516 which supplies electrical power to the mass storage device 520. The power sensor 526 is an internal sensor of the mass storage device 520, as the sensor 526 is included within the mass storage device 520 and is coupled to an internal power transmission line included within the mass storage device 520. As a result, the sensor 526 can measure electrical power consumption by the mass storage device 520 based at least in part upon electrical power consumed via the line 516.

As shown, sensor 526 is communicatively coupled to the microcontroller 528. In some embodiments, the microcontroller 528 is a secondary microcontroller in the mass storage device 520, where another separate microcontroller in the device 520 is configured to control data access operations with regard to device 522, performance of computing operations by device 520, some combination thereof, etc. The microcontroller 528 can receive power data generated by the sensor 526. The sensor 526 can include one or more various power sensors, including one or more of a sense resistor, a point of load device, etc. In some embodiments, the microcontroller 528 is electrically coupled to the line 516 in parallel with a sensor 526 which comprises an electrical resistor, and the microcontroller can determine the electrical power consumption by the device 520 based at least in part upon determining a strength of the electrical current through the parallel circuit and based in part upon determining the electrical resistance of the resistor.

In some embodiments, the microcontroller 528 transmits internally-generated power data to one or more externally-located systems. Such transmitting can include transmitting at least some of the internally-generated power data to a data control module 510 via an in-band communication link between the mass storage device 520 and the control module 510. In some embodiments, for example, mass storage device 520 includes a communication interface which is configured to communicate data to control module 510 via an in-band communication link 530, and the device 520 can include an in-band communication interface which is configured to communicate in-band signals via the link 530. The microcontroller can be configured to transmit at least some internally-generated power data via in-band communication. In some embodiments, in-band communication from the microcontroller can include communication over one or more known in-band communication interfaces, including one or more of PCI Express, SATA, SAS, some combination thereof, or the like.

In some embodiments, the data control module 510 includes one or more instances of firmware 511, including a BIOS, which is configured to access internally-generated power data from the mass storage device 520 via in-band communication with microcontroller 528 via an in-band communication link 530. In some embodiments, the microcontroller 528 is configured to store internally-generated power data in firmware-readable pages. In some embodiments, the microcontroller is configured to store-internally generated power data in Self-Monitoring, Analysis and Reporting Technology ("SMART") pages which can be read, by one or more of an instance of firmware, operating system, etc. via one or more interfaces of the mass storage device. An instance of firmware 511 can read the power data from the pages, via communication with device 520 and can transmit the power data to one or more externally-located systems via an in-band communication link 532. For example, in the illustrated embodiment, a rack 500 can include a baseband management controller (BMC) 540 which is communicatively coupled with one or more externally-located systems, including one or more power monitoring systems, via a communication link 542. An instance of firmware 511 can access power data, generated by sensor 526, from microcontroller 528 and the data can be transmitted to the BMC 540 from the module 510 via an in-band communication link 532.

In some embodiments, the module 510 includes an operating system 510, stored in a memory device, which can access and process the internally-generated power data from device 520 via in-band link 530. In some embodiments, the operating system included in module 510 can populate a portion of the data control module 510, the BMC, some combination thereof, etc., with representations of the various mass storage devices 520. Populating the module 510, BMC 540, etc. with representations of the various mass storage devices can include populating each representation with power data generated internally at the respective mass storage device 520. The control module 510, BMC 540, some combination thereof, etc. can process the populated power data and communicate the data to a power monitoring system via a communication link 542. In some embodiments, a BMC 540 can access power data stored on a memory device, including data stored on a memory device of the BMC 540, a memory device of the data control module 510, a memory device of a mass storage device 520, some combination thereof, etc.

Figure 6:
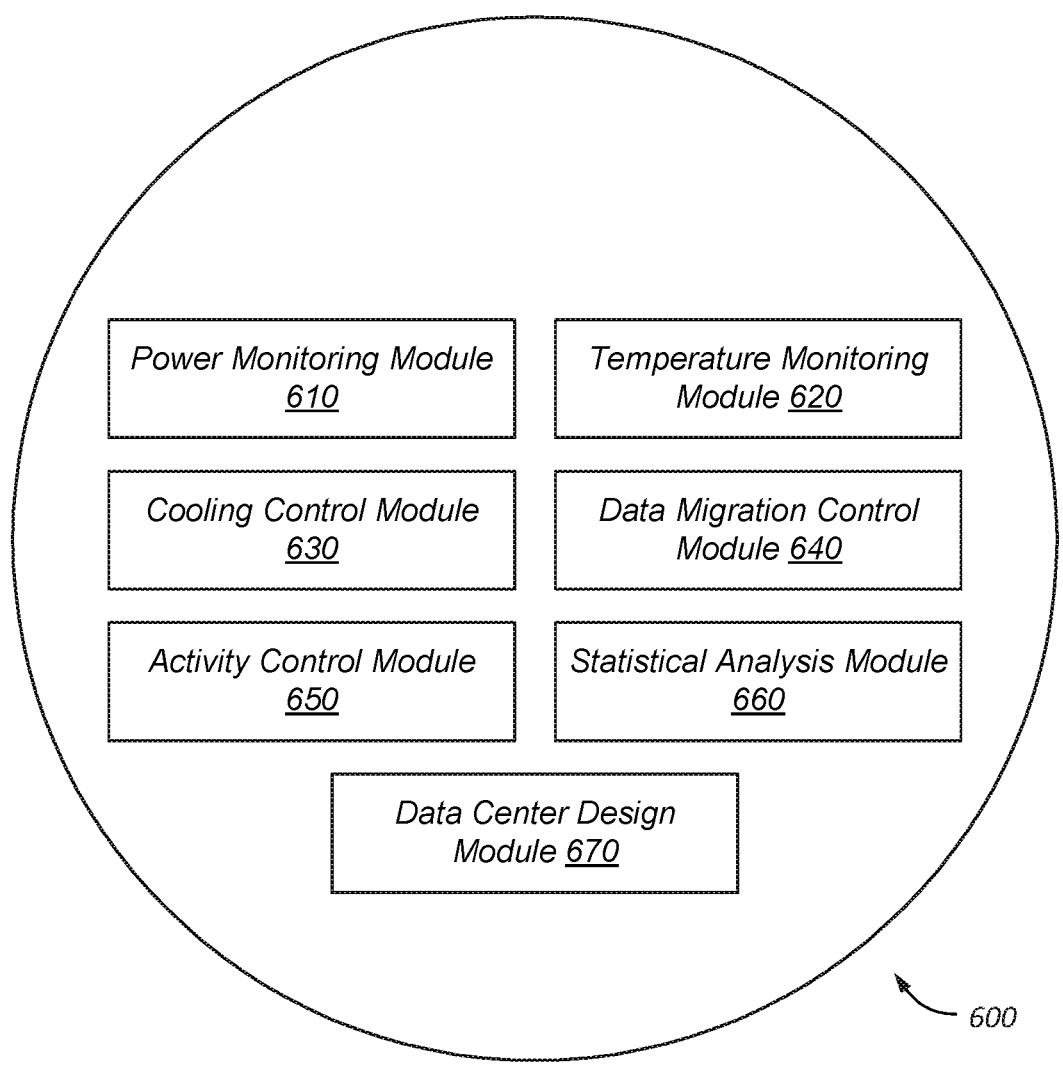
FIG. 6 is a schematic diagram illustrating power monitoring system, according to some embodiments.

FIG. 6 is a schematic diagram illustrating a power monitoring system, according to some embodiments. The power monitoring system 600 can be implemented by one or more computer systems and can be included in any of the embodiments included herein.

In some embodiments, a power monitoring system comprises one or more sets of modules which can monitor one or more of electrical power consumption by one or more mass storage devices included in one or more rack computer systems of one or more data centers. As shown, power monitoring system 600 includes a power monitoring module 610 which can receive and process one or more instances of power data generated by one or more power sensors in one or more data centers, where each instance of power data indicates electrical power consumption by a corresponding set of one or more mass storage devices monitored by the respective power sensor which generated the one or more instances of power data. In some embodiments, module 610 processes received power data to identify the corresponding set of mass storage devices for which electrical power consumption is indicated by the power data. The power data can include one or more instances of metadata which indicate a particular corresponding set of mass storage devices. For example, module 610 can access a database which associates each mass storage device in a given rack in a data center with a particular identifier, which can include an identifier of a particular data storage module, rack, etc. in which the respective mass storage device is located.

In some embodiments, module 610 responds to a receipt of an instance of power data at system 600 by determining the indicated amount of electrical power consumption by the corresponding set of mass storage devices and determining a timestamp, range of elapsed time, etc. associated with the indicated amount of electrical power consumption. The indicated amount of electrical power consumption can be stored, by module 610, in one or more databases, and the variation of electrical power consumption by one or more mass storage devices over time can be tracked.

In some embodiments, the power monitoring system 600 processes received instances of power data, indicating electrical power consumption by one or more corresponding sets of mass storage devices, to determine an operating temperature of each of the sets of mass storage devices. Such determined operating temperatures can be present operating temperatures of each of the sets of mass storage devices, including where the received power data indicates a present amount of electrical power consumed by the sets of mass storage devices.

As shown, power monitoring system 600 includes a temperature monitoring module 620 which can process one or more instances of power data generated by one or more power sensors in one or more data centers to determine an operating temperature of the one or more corresponding mass storage devices. In some embodiments, module 620 accesses a predetermined relationship between mass storage device electrical power consumption and mass storage device operating temperature and, based at least in part upon the accessed relationship and the electrical power consumption by one or more mass storage devices, indicated by the received one or more instances of power data, module 620 can determine an operating temperature of the one or more mass storage devices.

In some embodiments, module 620 accesses a particular predetermined relationship based on one or more instances of metadata associated with the corresponding one or more mass storage devices for which electrical power consumption is indicated by a received instance of power data. The instance of power data can include metadata which identify one or more characteristics of the corresponding mass storage devices for which electrical power consumption is indicated by the power data. Such characteristics can include an identifier associated with the one or more mass storage devices, an indication of a manufacturer of the one or more mass storage devices, an indication of a make or model of the one or more mass storage devices, some combination thereof, etc. In some embodiments, module 620 accesses a database which stores multiple separate predetermined relationships, where each relationship is associated with one or more mass storage device characteristics, including one or more of manufacturer, make and model, etc. In some embodiments, module 620 processes received power data to identify one or more mass storage device characteristics associated with the corresponding mass storage device indicated by the power data and subsequently, based on the identified characteristics, identify a particular predetermined relationship to which the indicated electrical power consumption by the corresponding mass storage device is to be applied to determine an operating temperature of the mass storage device. Identifying one or more mass storage device characteristics can include identifying a particular mass storage device identifier included in the power data, accessing a database which associates various identifier with one or more characteristics, and identifying one or more characteristics of the mass storage device based on correlating the identifier indicated in the power data with a database entry which associated the identifier with a set of mass storage device characteristics.

In some embodiments, module 620 applies a received indication of electrical power consumption by a corresponding mass storage device to a selected predetermined relationship between operating temperature and electrical power consumption to determine an operating temperature of the mass storage device. The determined operating temperature, in some embodiments, can be associated with a timestamp and stored in a database, such that the operating temperature of the mass storage device can be tracked over time.

In some embodiments, module 620 receives operating temperature data from one or more temperature sensors, included in one or more racks, which measure operating temperatures of one or more mass storage devices. The module can associate the temperature data with one or more particular mass storage devices to determine the operating temperature of the particular mass storage devices, based on the received temperature data.

In some embodiments, the power monitoring system 600 controls one or more operating states of one or more components which provide one or more instances of support to computing operations performed by mass storage devices, based at least in part upon the determined electrical power consumption of the mass storage devices, the determined operating temperatures of the mass storage devices, some combination thereof, etc. Such adjustment can include determining a target operating state of one or more components which is associated with a target operating temperature of a mass storage device, such that causing the component to operating at the target operating state can cause the mass storage device operating temperature to at least approach the target operating temperature. The adjustment can further include generating a command which can be transmitted to the component, where the command, when received at the component, causes the component to adjust the operating state of the component to the target operating state. The command can include a command, to one or more portion of the component, to adjust an amount of electrical power consumed by the portion of the component, such that the component's operating state is adjusted to the target operating state. For example, the component portion can include a motor, and commanding the motor to adjust the power consumption level of the motor to a particular amount of electrical power consumption can result in the motor adjusting the operating state of the component to a target operating state.

In some embodiments, controlling an operating state of one or more components which support computing operations includes controlling one or more of cooling of mass storage devices by one or more cooling systems, data migration between one or more mass storage devices, computing operation activity at one or more mass storage devices, some combination thereof, etc.

In some embodiments, the power monitoring system 600 controls cooling of one or more selected mass storage devices in one or more data centers based on the determined operating temperature of the selected mass storage devices. Such cooling control can include adjustably controlling operating states of one or more cooling systems included in a data center, including controlling one or more air moving devices which are included in the same rack as the selected mass storage devices. In some embodiments, the system 600 controls selected cooling systems, of a set of cooling systems included in a rack, based on a determined proximity of the selected cooling systems to the selected mass storage devices, a cooling capacity of the selected cooling systems, some combination thereof, etc.

As shown, system 600 includes a cooling control module 630 which is configured to generate control signals which cause one or more cooling systems to adjust cooling of one or more mass storage devices. As referred to herein, cooling systems can include one or more controllable cooling systems, including adjustable vents, air moving devices, etc. For example, module 630 can generate a command signal which adjusts an air flow rate induced by a given air moving device and causes an increased flow of air across one or more particular mass storage devices, thereby resulting in increased heat removal from one or more heat generating components of the one or more particular mass storage devices and a resulting decrease in operating temperature of the one or more particular mass storage devices.

In some embodiments, module 630 compares the determined operating temperature of a mass storage device with one or more thresholds. Such thresholds can include one or more threshold temperature values, one or more threshold rates of change of operating temperature over a given period of time, etc. Based on determining that an operating temperature of a mass storage device at least meets a particular threshold, module 630 can determine a particular adjustment to one or more particular selected cooling systems which are determined to cause a particular adjustment to the cooling of the mass storage device.

Determining an adjustment to a cooling system can include determining a target temperature to which the operating temperature of the mass storage device, which has been determined to have an operating temperature which at least meets a particular threshold, is to be adjusted. In some embodiments, module 630 can determine a target airflow rate based on the target operating temperature. For example, based on a difference between the target operating temperature and the present operating temperature of a mass storage device, module 630 can determine an amount of additional cooling of the mass storage device which will reduce the present operating temperature to the target operating temperature and can further determine an air flow rate across the mass storage device which can provide the determined amount of additional cooling. Such a determination can be based on a predetermined relationship between air flow rate and operating temperature.

In some embodiments, based at least in part upon determining a target air flow rate, module 630 can select one or more particular cooling systems and determine a particular adjustment to said cooling systems which will result in the target airflow across the mass storage device. The particular cooling systems can include one or more particular air moving devices which can be selected based on a determination that the particular air moving devices are located in a common data storage module with the mass storage device, are located in a common rack with the mass storage device, are within a certain proximity of the mass storage device, some combination thereof, etc. Determining an adjustment to a cooling system can include determining a target induced air flow rate by a particular selected air moving device. Module 630 can generate one or more command signals, which can be transmitted to the selected cooling systems, which cause the selected cooling systems to adjust cooling. For example, the module 630 can generate a command signal to an air moving device which causes the air moving device to adjust the induced air flow rate to a target air flow rate.

In some embodiments, a power monitoring system adjusts data migration to and from a mass storage device, by one or more web services, computing services, etc., based on the determined operating temperature of the mass storage device, which can be determined based on the electrical power consumption by the mass storage device. Excess data migration to a mass storage device with an already-high operating temperature can result in eventual overheating of the mass storage device. The power monitoring system can interact with one or more web services to at least partially restrict data migration to a mass storage device and, in some embodiments, cause data migration from the mass storage device to cause the operating temperature of the mass storage device to be reduced based at least in part upon reduced activity at the mass storage device.

As shown, system 600 includes a data migration control module 640. Module 640 can communicate messages with one or more web services, via one or more communication networks, to manage data migration by the one or more web services to and from a mass storage device. Where a mass storage device is determined to have an operating temperature which at least meets one or more thresholds, module 640 can generate one or more data migration commands which can be communicated to the one or more web services. A data migration command can be based at least in part upon the threshold which is reached by the mass storage device operating temperature. For example, if the operating temperature reaches a lowest threshold value in a series of thresholds, module 640 can generate a command to web services to restrict data migration, to the mass storage device, to data packets which are less than a certain size, etc. Where the operating temperature is determined to reach an intermediate threshold value, the generated command can be a command to restrict all data migrations to the mass storage device. Where the operating temperature is determined to reach a critical threshold value, the generated command can be a command to migrate some or all data away from the mass storage device.

In some embodiments, where an operating temperature of a mass storage device is determined at system 600 to be less than one or more particular thresholds, a data migration command generated at module 640 can include a command to increase data migration to the mass storage device, such that storage device utilization is optimized.

In some embodiments, the power monitoring system adjusts computing operation activity at a mass storage device based on communication with the mass storage device via one or more communication networks. Computing operation activity, also referred to herein interchangeably as "activity", can include a rate at which computing operations are performed on one or more particular mass storage devices, an amount of data stored at the one or more mass storage devices, some combination thereof, etc. As shown, system 600 includes an activity control module 650 which can, in some embodiments, generate activity adjustment commands to a mass storage device based at least in part upon a determination, at system 600, that the operating temperature of the mass storage device exceeds one or more thresholds. Such activity adjustment commands can include commands to adjust a maximum amount of data stored at the mass storage device, a rate at which various computing operations, including data access operations, are performed at the mass storage device, etc. Adjusting the activity at a mass storage device can result in reduced operating temperature of the mass storage device. In some embodiments, adjusting the activity at a mass storage device results in adjusting the electrical power consumption by the mass storage device. In some embodiments, module 650 adjusts activity at various mass storage devices to manage electrical power consumption by the various mass storage devices, including maintaining the electrical power consumption by the various mass storage devices beneath one or more threshold amounts of electrical power consumption. In some embodiments, activity adjustment commands are transmitted to one or more components which support computing operations in one or more racks, including one or more data control modules, microcontrollers included in one or more mass storage devices, etc., such that the command causes the one or more one or more data control modules, microcontrollers included in one or more mass storage devices, etc. to adjust the activity of one or more particular mass storage devices, based on the command.

In some embodiments, a power monitoring system performs a statistical analysis on electrical power consumption by various mass storage devices in one or more data centers.

Such analysis can include developing a statistical distribution of electrical power consumption by various mass storage devices over a particular period of elapsed time. Such a distribution can include a normal distribution. In some embodiments, such analysis can include determining one or more properties of the distribution, including an average, also referred to herein as the mean, of the distribution. In some embodiments, one or more properties of the distribution include a determined standard deviation from the mean.

As shown, system 600 can include a statistical analysis module 660 which can access electrical power consumption data, processed by module 610, over one or more particular selected periods of time and develop a statistical distribution of the electrical power consumption thereof. In some embodiments, module 660 can develop a statistical distribution of operating temperature of one or more mass storage devices over a particular selected period of time, based on stored power consumption data, stored operating temperature data, some combination thereof, etc. In some embodiments, module 660 can develop a statistical distribution of electrical power consumption by a selected set of mass storage devices. The selected set of mass storage devices can be selected based on one or more various determined similar characteristics, including common rack location, common data center, etc.

In some embodiments, a power monitoring system can manage a data center design, which can include a design for one or more future data centers which can be constructed in the future. The design can include various specifications regarding various structural parameters of various data center components which can be installed in the future data center, including specifications which specify particular restrictions on one or more structural parameters of one or more components. For example, a design can include a power distribution specification which specifies a structural parameter which includes a minimum power supply capacity of a power distribution system to be installed in a future data center. In another example, the design can include a cooling system specification which specifies a structural parameter which includes one or more of cooling capacity, air flow, etc. which a cooling system included in a rack computer system in the future data center must be configured to provide.

In some embodiments, the power monitoring system 600 includes a data center design module 670 which can adjust one or more specifications of a data center design, based at least in part upon monitoring electrical power consumption by one or more mass storage devices in one or more data centers over time. Module 670 can adjust various specifications based on determined statistical distributions of electrical power consumption, operating temperature, induced air flow rate, etc. For example, the module 670 can adjust the minimum power distribution system power supply capacity structural parameter specified by a specification in the design to correspond to total electrical power consumption by the mass storage devices in a data center which is two standard deviations above the determined mean of total electrical power consumption over a period of time. In another example, the module 670 can adjust a specification which specifies an air moving device structural parameter which can include the maximum air flow rate which can be induced by an air moving device in a rack computer system to a flow rate which is two standard deviations above the determined mean air flow rate induced by the air moving devices in a data center.

Figure 7:
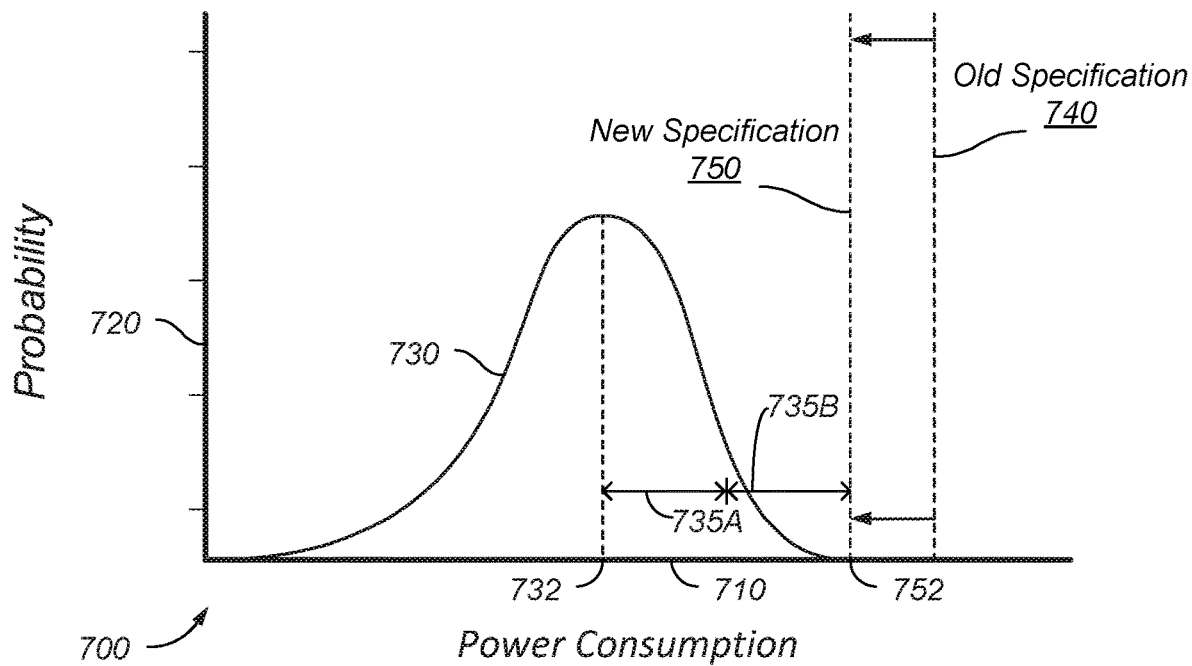
FIG. 7 illustrates a statistical analysis of electrical power consumption by mass storage devices in a presently-existing data center, according to some embodiments.

FIG. 7 illustrates a statistical analysis of electrical power consumption by mass storage devices in a presently-existing data center, according to some embodiments.

In some embodiments, adjusting a design specification of a data center design, where the design specification includes one or more specified structural parameters of one or more data center components which are included in a data center constructed according to the data center design, includes determining a new value of a structural parameter included in a specification based on a statistical analysis of one or more operational characteristics of a data center. In some embodiments, such an adjustment can include determining a particular standard deviation from the mean for a given operational characteristic and determining a design specification structural parameter based on the determined standard deviation.

FIG. 7 illustrates a graphical representation 700 of a statistical distribution 730 of individual electrical power consumption 710 by each of the mass storage devices in a data center, where the distribution indicates an instantaneous probability 720 that an individual mass storage device in the data center will consume a particular amount 710 of electrical power over a predetermined period of elapsed time. The distribution 730 can be developed based on processing power data associated with each of the mass storage devices in a data center over the period of elapsed time. In the illustrated embodiment, the distribution 730 is a normal distribution.

As shown, the developed distribution 730 can include an average, or mean, value 732 which indicates the average amount of electrical power consumption by an individual mass storage device. In the illustrated embodiment, the mean 732 is also the mode, as the probability that an individual mass storage device consumes the mean amount of electrical power is greater than a probability that the mass storage device consumes any other particular amount of electrical power.

In some embodiments, a standard deviation 735 can be determined for the statistical distribution. In some embodiments, a specification of a structural parameter of the amount of electrical power capacity in a future data center is determined based at least in part upon the standard deviation. For example, in the illustrated embodiment, a structural parameter value which indicates the amount of electrical power support required for each mass storage device in a data center is determined based on the amount of electrical power which more than two standard deviations 735A-B above the mean consumed electrical power 732 for individual mass storage devices.

In some embodiments, determining a structural parameter for the data center design includes overwriting a previously-existing structural parameter in the design. The previous specification could be determined based on tracking previous variations of electrical power consumption by mass storage devices in a previous period of elapsed time. In some embodiments, the previous structural parameter specified by a data center design specification is manually provided. In the illustrated embodiment, a previously-existing specification 740 includes a structural parameter value which is overwritten in the data center design with the new specification structural parameter value 750 based on the determination that the new specification structural parameter value 750 meets the threshold required two standard deviations above the mean amount 732. The resulting specification structural parameter value 750 can be used to select and install data center components which do not need to meet the more stringent threshold structural parameter value 740. Furthermore, as shown, the new specification structural parameter value 750 is based on actual electrical power consumption, and therefore can be a more realistic basis for designing the configuration of a future data center.

In some embodiments, a data center design specification structural parameter value can be determined based at least in part upon one or more various other processing of the statistical distribution. For example, a threshold structural parameter value can be determined based on a value for which the probability of the occurrence of the value is less than a certain probability. For example, specification structural parameter value 750 can be determined at the value 752 of electrical power consumption for which a probability that an individual mass storage device will consume the amount 752 of electrical power is less than a threshold probability.

Figure 8:
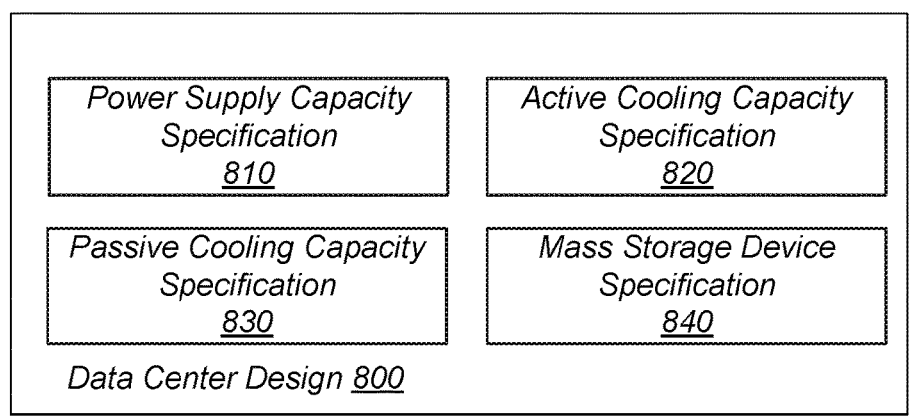
FIG. 8 illustrates a data center design, according to some embodiments. A data center design can be controlled by any of the power monitoring systems included in any of the embodiments included herein.

FIG. 8 illustrates a data center design, according to some embodiments. A data center design can be controlled by any of the power monitoring systems included in any of the embodiments included herein.

Data center design 800 includes various specifications 810-840 for various components in future data centers which are constructed based on the design 800. Data center components included within the constructed future data centers can be required to conform to the specifications 810-840. For example, various specifications in a data center design include one or more structural parameters of the one or more data center components installed in the future data center are required to meet. Various structural parameters include one or more values of one or more operational characteristics associated with one or more various components, one or more operational characteristic threshold values, some combination thereof, etc.

Design 800 includes a power supply capacity specification 810 which is associated one or more structural parameters of power distribution systems installed in the future data center, including power supply capacity of the power distribution systems. Power supply capacity can refer to the maximum amount of electrical power which can be supplied by a power distribution system. In some embodiments, specification 810 specifies a structural parameter, of a power distribution system, which includes an amount of power supply capacity based on the number of mass storage devices, racks, some combination thereof, etc. included in one or more particular portions of the future data center. For example, specification 810 can specify that an installed power distribution system be configured to supply at least 10 KVa of electrical power to a computer room for each rack computer system for which the computer room is configured to accommodate, such that a power distribution system which is to be installed in a data center to provide electrical power support to a computer room which is configured to accommodate 300 racks can be required to provide 3000 KVa of electrical power to the computer room. In another example, specification 810 can specify a particular amount of electrical power which a power distribution system installed in the future data center is to be configured to provide.

Design 800 includes an active cooling capacity specification 820 which is associated with one or more structural parameters of cooling systems installed in the future data center, including the active cooling capacity of the cooling systems. Active cooling capacity can refer to the maximum amount of cooling, which can be based on induced air flow, coolant flow of one or more particular coolants, etc., which can be supplied by a cooling system to remove heat from various heat-generating components in a rack. In some embodiments, specification 820 specifies a structural parameter, of an active cooling system, which includes an amount of air flow which individual cooling systems in a rack, which can include individual air moving devices, are required to be configured to induce.

Design 800 includes a passive cooling capacity specification 830 which is associated with one or more structural parameters of passive cooling systems, including the cooling capacity of passive cooling systems. Passive cooling systems can include one or more vents, louvers, etc. installed in the future data center. Passive cooling capacity can refer to the maximum amount of cooling, which can be based on air flow through one or more vents, number of vents, etc., which can be supplied by passive cooling systems in a rack to remove heat from various heat-generating components in a rack. In some embodiments, specification 830 specifies a structural parameter, of a passive cooling system, which includes a number of air flow vents which are required to be included in a rack.

Design 800 includes a mass storage device specification 840 which is associated with one or more structural parameters of mass storage devices which are to be installed in the future data center. Such structural parameters can include maximum operating temperature, maximum electrical power consumption, rate of operation performance, amount of data storage capacity, some combination thereof, etc.

Figure 9:
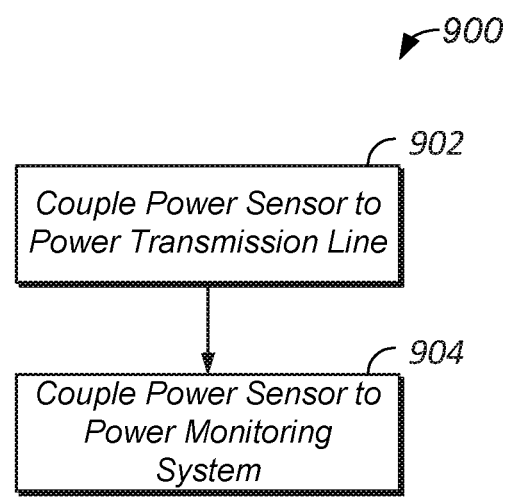
FIG. 9 illustrates configuring a rack computer system to provide power data indicating electrical power consumption of one or more mass storage devices in the rack computer system, according to some embodiments.

FIG. 9 illustrates configuring a rack computer system to provide power data indicating electrical power consumption of one or more mass storage devices in the rack computer system, according to some embodiments. The configuring 900 can be performed with regard to any of the embodiments of a power monitoring system included herein.

In some embodiments, the configuring 900 includes at least partially manufacturing one or more portions of a rack computer system, including at least partially manufacturing one or more mass storage devices.

At 902, a power sensor is coupled to at least one power transmission line which is configured to supply electrical power to at least one mass storage device when the mass storage device is installed in a data storage module. As a result, the power sensor is configured to measure electrical power supplied to the at least one mass storage device, electrical power consumed by the at least one mass storage device, etc.

In some embodiments, the power sensor is coupled to a power transmission line which is configured to be external to, and upstream of, one or more mass storage devices, such that the power sensor is external to the corresponding mass storage device being monitored by the power sensor. For example, coupling a power sensor to at least one power transmission line can include coupling a power sensor to a power transmission line included in a backplane, where the backplane can be coupled to a chassis of a data storage module and one or more mass storage devices can be coupled to the backplane to electrically couple the mass storage devices to a power distribution system via the backplane.

In some embodiments, coupling a power sensor to a power transmission line external to a mass storage device includes coupling a sensing element, which can include one or more of a resistor device, point of load D-to-D device, some combination thereof, or the like to the power transmission line, and coupling a sensing circuit to the power transmission line in parallel with the sensing element, such that the electrical power consumption of a mass storage device can be measured based on one or more properties of electrical power flowing through the sensing circuit. For example, where a sensing element is a resistor having a particular electrical resistance, the electrical power flowing through a power transmission line, and thus the electrical power consumed by one or more mass storage devices, can be measured based on the known particular resistance of the resistor and a measured electrical current though the sensing circuit.

In some embodiments, the power sensor is coupled to a power transmission line which is internal to a mass storage device and carries electrical power, received from a power distribution system via a power interface of the mass storage device, to one or more components of the mass storage device. In some embodiments, the power sensor is coupled to a microcontroller of the mass storage device. The microcontroller can include a central processing unit (CPU) included in the mass storage device and can be configured to control data access operations associated with the mass storage device, including read operations, write operations, etc. The microcontroller, in addition to controlling data access operations, can be configured to receive and process data generated by an internal power sensor, where the data is referred to herein interchangeably as "power data" and "measurement data". The microcontroller, in processing receiving internally-generated power data, can convert the data to one or more various formats, store the data in one or more firmware-readable pages, etc.

At 904, the power sensor is coupled to a power monitoring system. The power monitoring system can be implemented by one or more computer systems. Coupling the power sensor with the power monitoring system can include communicatively coupling the power sensor to the power monitoring system via one or more communication links.

In some embodiments, where a power sensor includes a sensing element coupled to a power transmission line externally to the mass storage device and a sensing circuit coupled in parallel to the sensing element, coupling the power sensor to a power monitoring system can include coupling the sensing circuit to a controller device, which can include a baseboard management controller, where the controller device measures the one or more properties of electrical power flowing through the sensing circuit and determines the electrical power consumption of the one or more mass storage devices based on the measured properties. Such determined electrical power consumption can be stored, by the controller device, as power data. The controller device can transmit the power data, via one or more communication networks, to the power monitoring system.

In some embodiments, where a power sensor is an internal power sensor included in a mass storage device, coupling the power sensor to a power monitoring system can include coupling the mass storage device with one or more interfaces of a data storage module. Such coupling can include coupling the mass storage device to a backplane in the data storage module, coupling a power interface of the mass storage device to a power outlet interface included in a backplane, coupling one or more communication interfaces of the mass storage device to one or more communication links included in the data storage module, etc.

In some embodiments, the microcontroller is configured to transmit power data to a data control module, which can be included in the data storage module, a data control module included in the rack computer system, etc., via a side-band channel. As a result, the mass storage device can include a side-band communication interface and coupling the power sensor with the power monitoring system, in some embodiments, includes coupling the mass storage device to one or more externally-located systems, including a data control module, via a side-band communication link via the side-band communication interface.

In some embodiments, the microcontroller is configured to transmit power data to a controller device via an in-band channel. For example, the microcontroller can be configured to interact with one or more instances of firmware included in the rack computer system, an operating system stored in a memory of one or more data control modules, controller devices, etc. included in the rack computer system, some combination thereof, or the like, where the one or more instances of firmware, operating system, etc. can be configured to access power data from the microcontroller and provide said power data to a controller device, which can include a baseboard management controller (BMC), via an in-band communication link. As a result, coupling the power sensor with the power monitoring system, in some embodiments, includes coupling an in-band communication interface of the mass storage device, which can be used for communication of data and data access commands to and from the mass storage device, to an in-band communication link in the data storage module.

Figure 10:
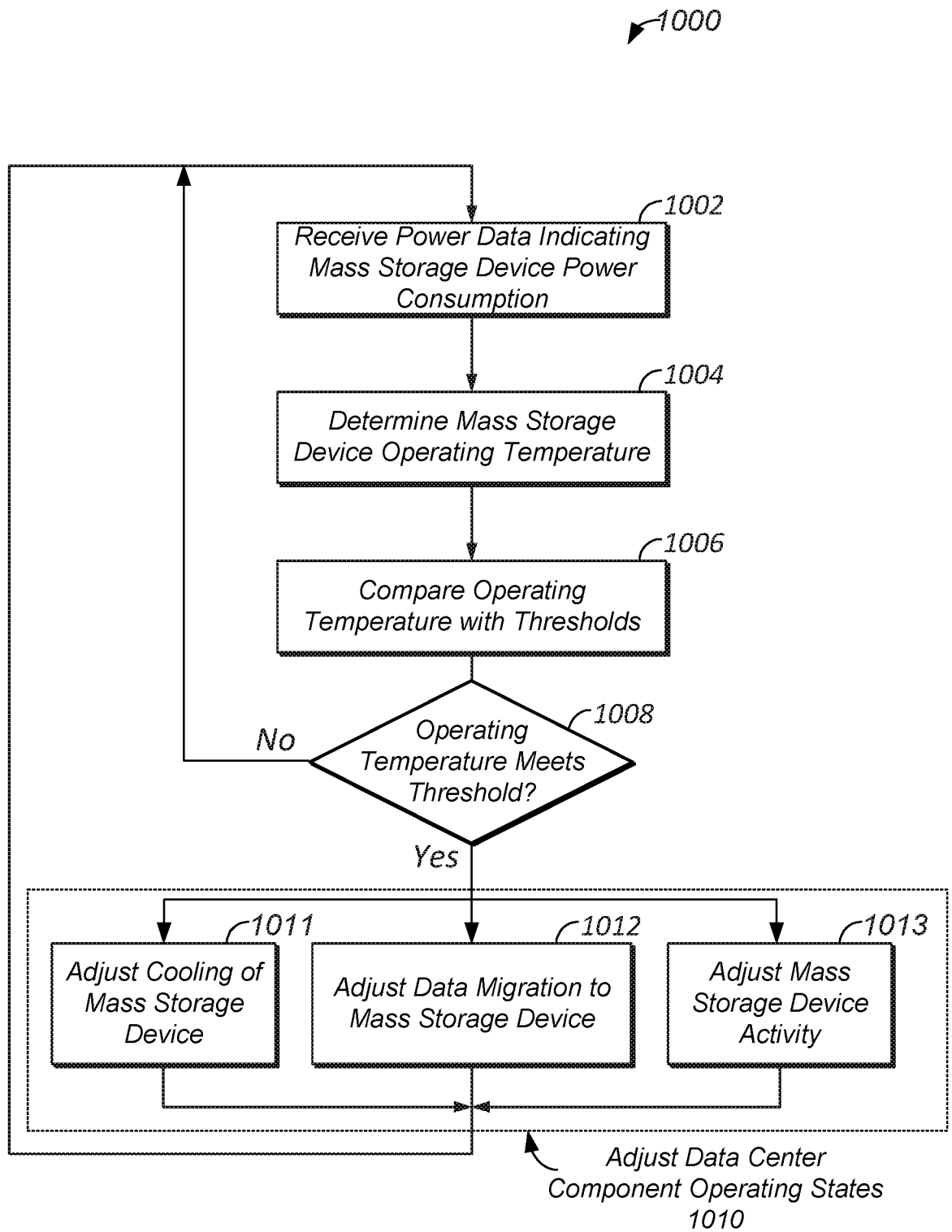
FIG. 10 illustrates adjusting operating states of one or more components which support computing operations performed in one or more rack computer systems based on power data indicating electrical power consumption by one or more mass storage devices in the rack computer systems, according to some embodiments.

FIG. 10 illustrates adjusting operating states of one or more components which support computing operations performed in one or more rack computer systems based on power data indicating electrical power consumption by one or more mass storage devices in the rack computer systems, according to some embodiments. The adjusting 1000 can be implemented by a power monitoring system according to any of the embodiments included herein. The power monitoring system can be implemented by one or more computer systems.

At 1002, one or more instances of power data are received from one or more power sensors. The one or more instances can include multiple sets of instances of power data which can be received concurrently from multiple power sensors included in a data storage module. Instances of power data can be received from various power sensors via one or more various communication links, including a communication network, an in-band communication link, a side-band communication links, some combination thereof, or the like.

In some embodiments, a given instance of power data received from a given power sensor indicates electrical power consumption by one or more corresponding mass storage devices included in a particular "set" or "limited selection" of the mass storage devices included in a rack computer system. In some embodiments, the "set" or "limited" selection of mass storage devices is a single mass storage device, such that a given instance of power data received from a given power sensor indicates electrical power consumption by a corresponding individual mass storage device. Indicated electrical power consumption can include an amount of electrical power consumed by the mass storage device over a particular period of elapsed time, an instantaneous flow rate of electrical energy to the mass storage device, etc.

At 1004, the one or more instances of power data are processed to determine present operating temperatures associated with one or more corresponding mass storage devices. Such processing can include applying a received indication of electrical power consumption by a given set or limited selection of mass storage devices to a predetermined relationship between electrical power consumption by the given set or limited selection of mass storage devices to a temperature of the given set or limited selection of mass storage devices. For example, where power data indicating electrical power consumption by a single mass storage device is received from a power sensor, the power data can be processed, using a predetermined relationship between electrical power consumption and temperature of the mass storage device, to determine a temperature of the mass storage device. In some embodiments, the received power data includes timestamp data indicating a period of time during which the electrical power consumption indicated by the power data occurred, and the period of time can include the present time, such that the power data comprises real-time measurements of power consumption.

In some embodiments, the predetermined relationship is a relationship between electrical power consumption and temperature of a mass storage device of a common type, relative to the mass storage device for which electrical power consumption is indicated by a received instance of power data. The relationship can be determined based on monitoring variations in operating temperature and electrical power consumption by a particular mass storage device over time, and the determined relationship can be associated with one or more various mass storage devices, such that power data indicating electrical power consumption by a particular mass storage device is processed using a particular relationship associated with the mass storage device to determine an operating temperature of the mass storage device.

At 1006 and 1008, operating temperatures of one or more sets or limited selections of mass storage devices, determined at 1004 based on indicated electrical power consumption by the one or more sets or limited selections of mass storage devices, are compared with one or more sets of operating temperatures thresholds to determine if the determined operating temperature of the mass storage device at least meets one or more of the thresholds. If not, as shown, monitoring continues. If so, as shown at 1010, one or more various adjustments to operating states of one or more components, which provide support to the performance of computing operations in one or more racks, can be implemented.

As shown at 1010, one or more various component operating state adjustments can be implemented based on a determination that an operating temperature of a set of mass storage devices at least meets one or more thresholds. The particular adjustments 1011, 1012, 1013 which are implemented can be selected based on one or more components and operating states associated therewith. In some embodiments, multiple adjustments are implemented concurrently as part of implementing adjustments 1010 to various operating states of various components.

At 1011, a component operating state adjustment which can be implemented includes adjusting cooling, of the one or more mass storage devices, induced by one or more cooling systems. Such adjusting can include generating command signals to one or more air moving devices included in the same rack computer system as the one or more mass storage device to adjust the rate at which air flows across the mass storage device and removes heat from the mass storage device.

Such adjusting can include determining, based at least in part upon the determined operating temperature of the mass storage device at 1004, a target operating temperature of the mass storage device and determining an adjustment in air flow across the mass storage device which correlates to the target operating temperature. Such determination can include applying the determined operating temperature, target operating temperature, and present air flow rate to a predetermined relationship between operating temperature and air flow rate. The present air flow rate can be determined based on determined present electrical power consumption by one or more air moving devices in the data storage module. In addition, a target power consumption level for a cooling system can be determined based on a predetermined relationship between electrical power consumption by one or more portions of the air moving device, such as a motor, and a target air flow rate. Based on the relationship, determined operating temperature of the mass storage device, and target operating temperature, a target power consumption level of the one or more air moving devices can be determined.

In some embodiments, determining a target power consumption level includes determining a target fan speed of a particular selected air moving device in the data storage module, where the air moving device can be selected based at least in part upon location with respect to the mass storage device. For example, a particular air moving device can be selected, and a target power consumption level can be determined for the air moving device, based at least in part upon a determination that the air moving device is the most proximate air moving device to the mass storage device.

In some embodiments, based at least in part upon one or more of a determined target air flow rate, target power consumption level, etc. of a selected one or more air moving devices, an output command signal is generated for transmission to said air moving devices, where the command signal commands a particular adjustment to the air moving devices which is determined to induce the target air flow rate. A command signal can command a particular adjustment to electrical power consumption by one or more portions of the one or more air moving devices to cause the target air flow rate to be induced by the one or more air moving devices For example, where the selected air moving device includes a fan driven by a variable speed motor, generating an output command signal to the air moving device includes generating a command signal which causes the motor to adjust to a particular amount of electrical power consumption which is determined to be associated with inducing the target air flow rate.

At 1012, a component operating state adjustment which can be implemented includes adjusting data migration to and from the mass storage device. Such adjustment can include restricting the migration of data, computing operations, etc. to the mass storage device, so that increases in operations performed by the mass storage device, and corresponding increases in operating temperature, are precluded. Such adjustment can include communicating with a web service which manages data migrations between various mass storage devices included in various data storage modules, rack computer systems, etc. in one or more data centers. Such communication can include transmitting a restriction command to the web service. The restriction command can include a mass storage device identifier which identifies the particular mass storage device relative to other mass storage devices and indicates a particular data migration restriction associated with the identified mass storage module.

The data migration restriction can include a complete restriction on data migration to and from the mass storage device, a one-way restriction which restricts data migration to the mass storage device and does not restrict data migration from the mass storage device, a partial restriction which restricts data migration of data exceeding a certain size, some combination thereof, or the like. Communicating a restriction command to a web service can include transmitting the command to one or more computer systems implementing the web service, via one or more communication networks. In some embodiments, the restriction command can include an expiration timestamp associated with the data migration restriction, whereby the data migration restriction can be disregarded by the web service after the expiration timestamp is reached. In some embodiments, a data migration restriction removal command can be communicated to the data storage, based at least in part upon a determination that an operating temperature associated with the mass storage device is less than one or more thresholds.

In some embodiments, adjusting data migration to a mass storage device includes generate a command, to one or more web services, commanding the web service to adjust whether the mass storage devices is selected to perform a computing operation. The command can include a command to restrict the mass storage device from being selected to perform computing operations which meet a minimum size. In some embodiments, the command includes a command to restrict whether the mass storage device is made a "primary" device in performing a computing operation as part of a set of mass storage devices, whether the mass storage device is made a "replica" device in performing a computing operation as part of a set of mass storage devices, whether the mass storage device is selected to perform any part of one or more computing operations, some combination thereof, etc.

At 1013, an operation adjustment which can be implemented includes adjusting activity in the mass storage device, also referred to herein as mass storage device activity. In some embodiments, such adjusting includes adjusting the amount of computing operations performed by the mass storage device within one or more periods of elapsed time. In some embodiments, such adjusting includes adjusting the rate at which computing operations are performed by the mass storage device. In some embodiments, such adjusting can include commanding that various data, computing operations associated therewith, etc. be migrated away from the mass storage device to one or more other mass storage devices.

In some embodiments, adjusting mass storage device activity includes generating one or more commands which, when transmitted to the mass storage device, cause one or more components of the mass storage device to adjust a rate at which various computing operations are performed by one or more components of the mass storage device. In some embodiments, such computing operations can include one or more of data access operations, data processing operations, some combination thereof, etc. For example, a generated command can include a data writing adjustment command which commands a microcontroller of the mass storage device to adjust the amount of data written to a data storage component of the mass storage device. Such an amount can be expressed in terms of terabytes written (TBW) to the data storage component.

In some embodiments, adjusting mass storage device activity includes generating one or more data migration commands which, when transmitted to a web service implemented on one or more computer systems, commands the web service, to migrate one or more instances of data from the mass storage device to another mass storage device. The one or more instances of data can be specifically identified in the data migration command. In some embodiments, the data migration command specifies a particular amount of data and commands that at least the particular amount of data be migrated away from the mass storage device. Data migration away from the mass storage device can reduce activity at the mass storage device, which can result in a reduction in operating temperature of the mass storage device.

In some embodiments, implementing adjustment 1010 includes implementing one or more selected particular adjustments 1011-1013. The particular adjustments can be selected based at least in part upon which thresholds are determined to be met by the operating temperature at 1006-1008. For example, where the operating temperature is determined to have reached a first temperature threshold, adjustment 1010 can include adjusting cooling 1011 of the mass storage device, where selectively implementing the adjustment 1011 is associated with the first threshold. Where the operating temperature is determined to have reached a higher second temperature threshold, adjustment 1010 can include adjusting cooling 1011 of the mass storage device and adjusting data migration 1012 to the mass storage device, where selectively implementing the adjustments 1011 and 1012 are each associated with the second threshold. Where the operating temperature is determined to have reached a higher third temperature threshold, adjustment 1010 can include adjusting cooling 1011 of the mass storage device, adjusting data migration 1012 to the mass storage device, and adjusting activity 1013 at the mass storage device, where selectively implementing the adjustments 1011-1013 are each associated with the third threshold.

In some embodiments, various adjustments 1011-1013 are associated with separate priorities, such that certain, higher-priority adjustments are implemented if other, lower-priority adjustments are already implemented. For example, adjustment 1011 can be associated with a highest priority, adjustment 1012 can be associated with a priority less than that for adjustment 1010, and adjustment 1013 can be associated with a priority less than the for both adjustments 1010-1011. In such embodiments, adjusting 1010 includes selectively adjusting cooling 1011 where the amount of unused cooling capacity which can be applied via adjustment 1011 is more than a threshold amount, selectively adjusting data migration 1012 to the mass storage device based at least in part upon a determination that the amount of unused cooling capacity which can be applied via adjustment 1011 is less than a threshold amount (e.g., the fan drive for an air moving device is already at a maximum speed and thus the air moving device cannot provide additional cooling), and selectively adjusting activity 1013 at the mass storage device based at least in part upon a determination that both the amount of unused cooling capacity which can be applied via adjustment 1011 is less than a threshold amount (e.g., the fan drive for an air moving device is already at a maximum speed and thus the air moving device cannot provide additional cooling) and data migration 1012 to the mass storage device is fully restricted (e.g. data migration to the mass storage device is fully inhibited).

Figure 11:
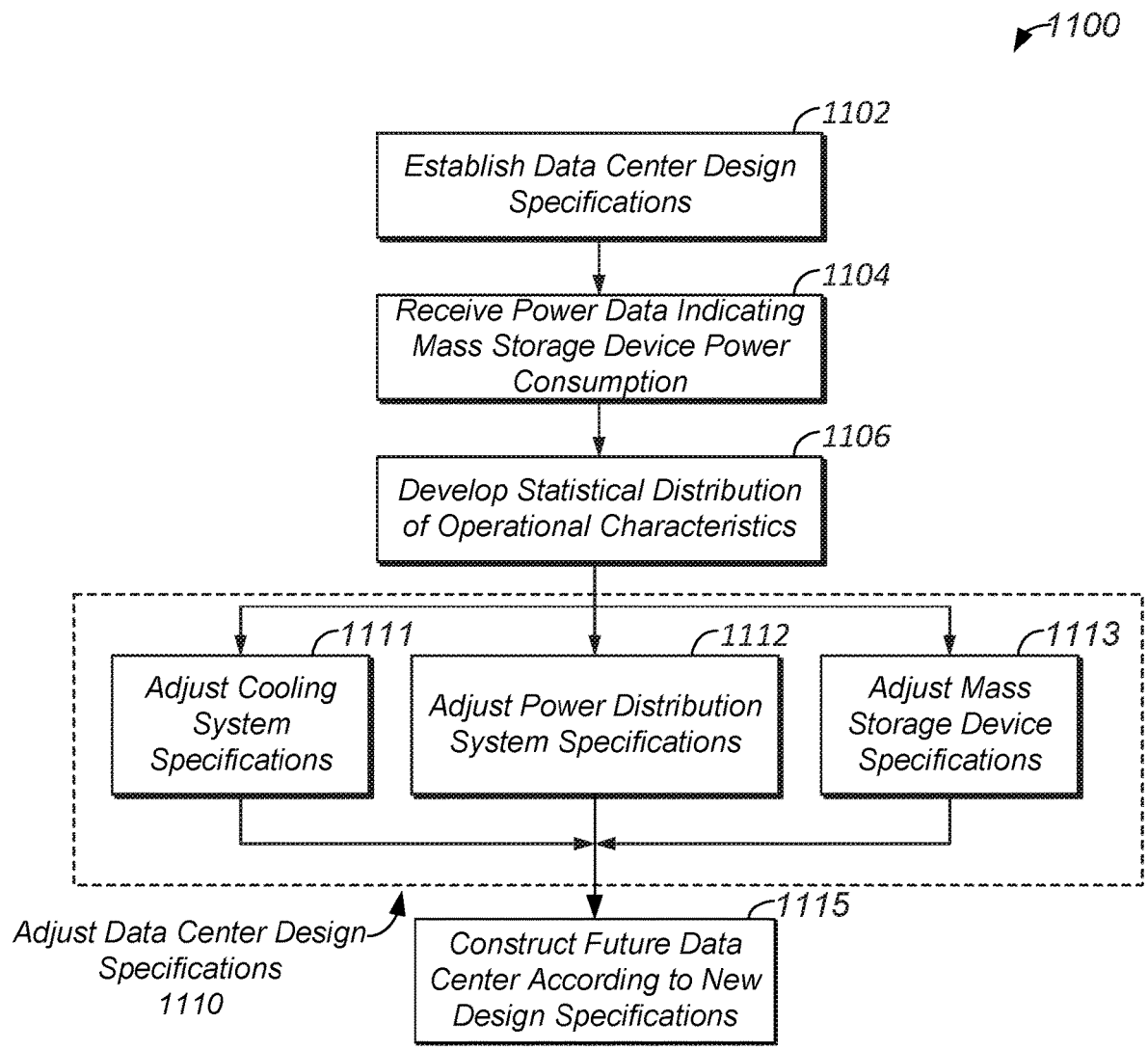
FIG. 11 illustrates adjusting one or more data center designs based on power data indicating electrical power consumption by one or more mass storage devices in rack computer systems of one or more presently-existing data centers, according to some embodiments.

FIG. 11 illustrates adjusting one or more data center designs based on power data indicating electrical power consumption by one or more mass storage devices in rack computer systems of one or more presently-existing data centers, according to some embodiments. The adjusting 1100 can be implemented by a power monitoring system according to any of the embodiments included herein. The power monitoring system can be implemented by one or more computer systems.

At 1102, a data center design is established. The data center design, also referred to herein interchangeably as a "design configuration", can include one or more various specifications of one or more various components of a future data center, where a future data center can be constructed based at least in part upon the various specifications included in the design. Such specifications for various components of the data center, also referred to herein interchangeably as data center components, can include structural parameters of the various components. Structural parameters of data center components can include one or more of power supply capacity structural parameters for one or more power distribution systems to be installed in the future data center, cooling capacity structural parameters for one or more cooling systems to be installed in the future data center, rack computer system structural parameters for rack computer systems to be installed in the future data center, some combination thereof, etc.

In some embodiments, a data center design includes one or more rack computer system structural parameters of rack computer systems to be installed in a data center, where the rack computer system structural parameters specify one or more of maximum rated electrical power consumption, maximum data storage, maximum operating temperature, some combination thereof, etc. for mass storage devices to be included in rack computer systems installed in a future data center. In some embodiments, a rack computer system structural parameter specifies one or more of minimum and maximum induced air flow rates, electrical power consumption, etc. for air moving devices which can be included in the rack computer systems.

In some embodiments, a data center is at least partially constructed based at least in part upon the data center design. For example, where a data center design includes a mass storage device structural parameter which specifies maximum operating temperature, mass storage devices which are selected and installed in rack computer systems in the constructed data center can be restricted to mass storage devices having a maximum operating temperature which at least meets the structural parameter. In another example, where a data center design specifies an air moving device maximum air flow rate structural parameter, air moving devices which are selected and installed in rack computer systems in the constructed data center can be restricted to air moving devices which are configured to induce a maximum air flow rate which at least meets the structural parameter. In another example, where a data center design specifies a power distribution system structural parameter of maximum power support, a power distribution system which is installed in the constructed data center can be restricted to a power distribution system which is configured to provide at least the specified amount of electrical power.

At 1104, one or more instances of power data are received from one or more power sensors included in one or more data centers. The one or more instances can include multiple sets of instances of power data which can be received concurrently from multiple power sensors included in one or more rack computer systems in one or more data centers. Instances of power data can be received from various power sensors via one or more various communication links, including a communication network, an in-band communication link, a side-band communication links, some combination thereof, or the like.

In some embodiments, a given instance of power data received from a given power sensor indicates electrical power consumption by one or more corresponding mass storage devices included in a particular "set" or "limited selection" of the mass storage devices included in a rack computer system. In some embodiments, the "set" or "limited" selection of mass storage devices is a single mass storage device, such that a given instance of power data received from a given power sensor indicates electrical power consumption by a corresponding individual mass storage device. Indicated electrical power consumption can include an amount of electrical power consumed by the mass storage device over a particular period of elapsed time, an instantaneous flow rate of electrical energy to the mass storage device, etc.

At 1106, based at least in part upon received instances of power data, one or more instances of operational characteristics data are analyzed, via one or more various statistical analysis methods, to develop a statistical distribution of one or more operational characteristics in one or more data centers over one or more periods of time. Operational characteristics can include one or more of electrical power consumption, cooling system power consumption, induced air flow rates, mass storage device activity, operational temperatures, some combination thereof, etc. In some embodiments, a statistical distribution can include a probability distribution associated with individual electrical power consumption by the mass storage devices in one or more data centers. The probability distribution can include a continuous distribution. In some embodiments, developing a statistical distribution of power consumption by various mass storage devices includes determining average electrical power consumption by the mass storage devices, a value of a standard deviation from the average, etc.

In some embodiments, a developed statistical distribution of electrical power consumption includes a statistical distribution of individual electrical power consumption by each of the mass storage devices, such that an average electrical power consumption associated with the distribution is average individual mass storage device electrical power consumption. In some embodiments, the developed statistical distribution of electrical power consumption includes a statistical distribution of total electrical power consumption by the mass storage devices in one or more particular rack computer systems, computer rooms, data centers, etc., such that an average electrical power consumption associated with the distribution is an average total mass storage device electrical power consumption.

At 1110, one or more of the specifications included in the data center design are adjusted based on the developed statistical distribution of one or more operational characteristics. In some embodiments, one or more specifications, which can include one or more structural parameters of one or more data center components, are determined based on an analysis of the statistical distribution of said one or more operational characteristics. Various adjustments 1111, 1112, and 1113 can be implemented based on the developed statistical distributions at 1106.

For example, as shown at 1111, in some embodiments a cooling capacity specification which includes a structural parameter of a set of cooling systems to be included in a rack computer system in a future data center is determined based on an amount of electrical power which is equal to two standard deviations above the average electrical power consumption by individual mass storage devices in a computer room over a period of elapsed time, where the operating temperature of the mass storage devices is determined based on the electrical power consumption by the mass storage device and a predetermined relationship between electrical power consumption and operating temperature. Where a developed statistical distribution at 1106 includes a statistical distribution of the individual electrical power consumption by the mass storage devices, in all of the rack computer systems in a computer room, a cooling capacity structural parameter of a cooling system to be included in a rack computer system in the data center design can be determined based on an amount of electrical power consumption which is two standard deviations above the average amount of individual power consumed in the computer room over one or more periods of elapsed time.

In some embodiments, adjusting a cooling capacity structural parameter specification at 1111 includes adjusting one or more active cooling capacity structural parameter specifications, which can include one or more of a specified cooling capacity of an active cooling system, a maximum flow rate of coolant, air, etc. induced by one or more cooling systems, at least partial range of power consumption of one or more air moving devices, pumps, etc., form factor of one or more cooling systems, structural dimension restrictions for one or more cooling systems, etc. An active cooling capacity structural parameter specification can include a specified mode of cooling provided by one or more cooling systems. In some embodiments, adjusting a cooling capacity structural parameter specification at 1111 includes adjusting one or more passive cooling capacity structural parameter specifications, which can include one or more of a specified number of vents in a rack, size of vents in a rack, flow area within one or more portion of a rack, etc.

In another example, as shown at 1112, in some embodiments a power supply capacity structural parameter specification for a power distribution system which is to provide electrical power support to rack computer systems in a computer room of a future data center is an amount of electrical power which is equal to two standard deviations above the average total electrical power consumption by mass storage devices in a computer room over a period of elapsed time. Where a developed statistical distribution at 1106 includes a statistical distribution of the total electrical power consumption by all of the mass storage devices, in all of the rack computer systems in a computer room, a power supply capacity structural parameter specification in the data center design can be determined based on an amount of electrical power consumption which is two standard deviations above the average amount of total power consumed in the computer room over one or more periods of elapsed time.

In another example, as shown at 1113, in some embodiments a mass storage device structural parameter specification for mass storage devices which are to be installed in a future data center specifies a maximum operating temperature of the mass storage devices which is an operating temperature which is equal to two standard deviations above the average operating temperatures of mass storage devices in a data center over a period of elapsed time. Where a developed statistical distribution at 1106 includes a statistical distribution of the operating temperature of individual mass storage devices, in all of the rack computer systems in a computer room, the mass storage device structural parameter specification in the data center design can be determined based on an operating temperature which is two standard deviations above the average operating temperature indicated in the distribution. As a result, a mass storage device structural parameter specification is adjusted to specify that mass storage devices installed in the data center are to have a maximum operating temperature which at least meets the temperature value which is two standard deviations above the average operating temperature indicated in the distribution.

At 1115, one or more data centers are constructed based at least in part upon the data center design. The various components installed in the data center, at 1115, can be selected, constructed, installed, etc. based at least in part upon the specifications adjusted at 1110. As a result, the constructed data center can have operational characteristics which closely conform to actual operational requirements, thereby resulting in reduced unneeded expenditure of capital and operational resources.

Figure 12:
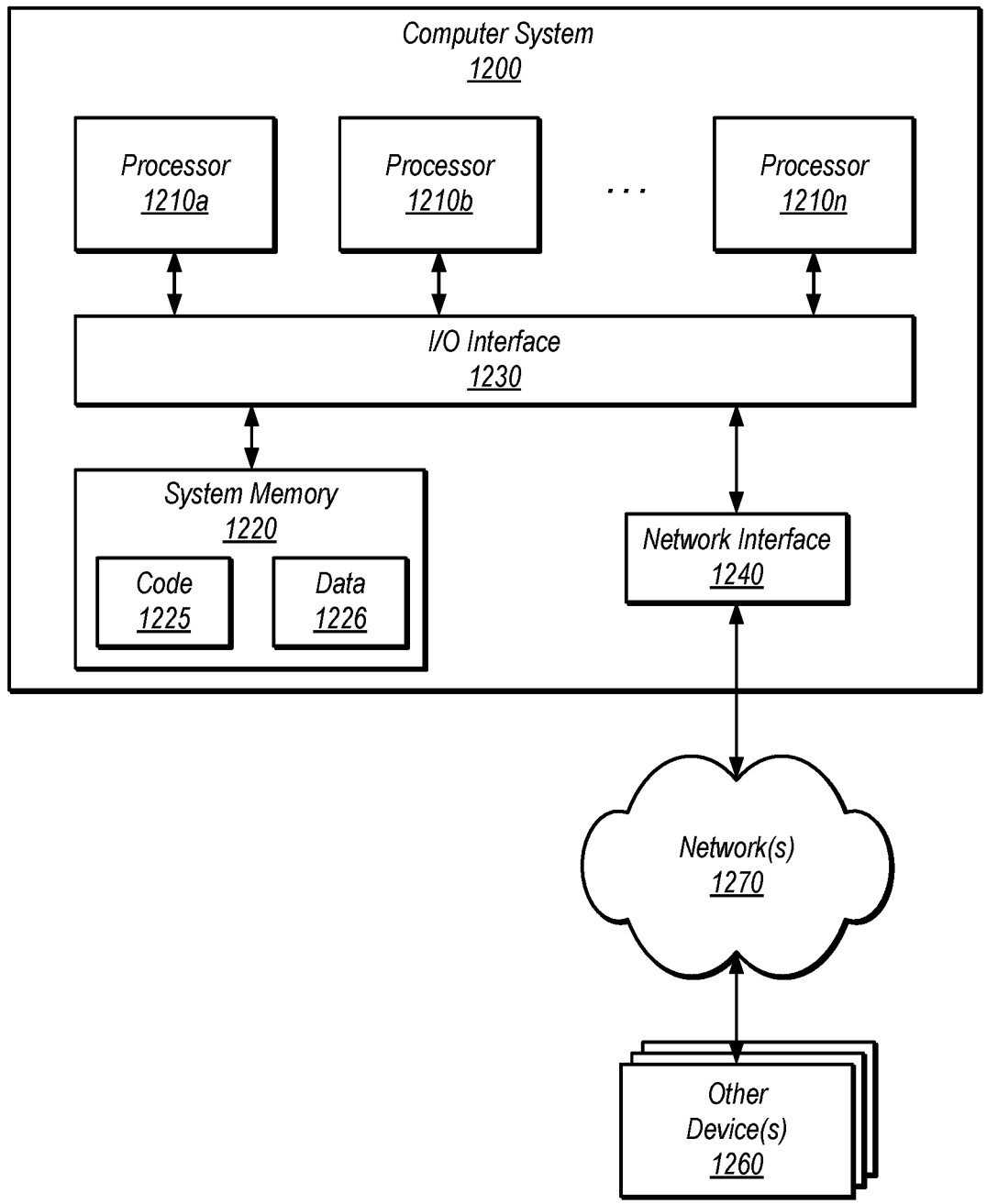
FIG. 12 is a block diagram illustrating an example computer system that may be used in some embodiments.

FIG. 12 is a block diagram illustrating an example computer system that may be used in some embodiments.

In some embodiments, a system that implements a portion or all of one or more of the technologies, including but not limited to a portion or all of apparatuses, methods and systems for mass storage device electrical power consumption monitoring, data center operations control, data center design control, and various electrical power consumption-based control methods, systems, devices, and apparatuses as described herein, may include a general-purpose computer system that includes or is configured to access one or more computer-accessible media, such as computer system 1200 illustrated in FIG. 12. In the illustrated embodiment, computer system 1200 includes one or more processors 1210 coupled to a system memory 1220 via an input/output (I/O) interface 1230. Computer system 1200 further includes a network interface 1240 coupled to I/O interface 1230.

In various embodiments, computer system 1200 may be a uniprocessor system including one processor 1210, or a multiprocessor system including several processors 1210 (e.g., two, four, eight, or another suitable number). Processors 1210 may be any suitable processors capable of executing instructions. For example, in various embodiments, processors 1210 may be general-purpose or embedded processors implementing any of a variety of instruction set architectures (ISAs), such as the x86, PowerPC, SPARC, or MIPS ISAs, or any other suitable ISA. In multiprocessor systems, each of processors 1210 may commonly, but not necessarily, implement the same ISA.

System memory 1220 may be configured to store instructions and data accessible by processor(s) 1210. In various embodiments, system memory 1220 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as including but not limited to a portion or all of apparatuses, methods and systems for mass storage device electrical power consumption monitoring, data center operations control, data center design control, and various electrical power consumption-based control methods, systems, devices, and apparatuses as described herein, are shown stored within system memory 1220 as code 1225 and data 1226.

In one embodiment, I/O interface 1230 may be configured to coordinate I/O traffic between processor 1210, system memory 1220, and any peripheral devices in the device, including network interface 1240 or other peripheral interfaces. In some embodiments, I/O interface 1230 may perform any necessary protocol, timing or other data transformations to convert data signals from one component (e.g., system memory 1220) into a format suitable for use by another component (e.g., processor 1210). In some embodiments, I/O interface 1230 may include support for devices attached through various types of peripheral buses, such as a variant of the Peripheral Component Interconnect (PCI) bus standard or the Universal Serial Bus (USB) standard, for example. In some embodiments, the function of I/O interface 1230 may be split into two or more separate components, such as a north bridge and a south bridge, for example. Also, in some embodiments some or all of the functionality of I/O interface 1230, such as an interface to system memory 1220, may be incorporated directly into processor 1210.

Network interface 1240 may be configured to allow data to be exchanged between computer system 1200 and other devices 1260 attached to a network or networks 1250, such as other computer systems or devices as illustrated in FIGS. 1 through 11, for example. In various embodiments, network interface 1240 may support communication via any suitable wired or wireless general data networks, such as types of Ethernet network, for example. Additionally, network interface 1240 may support communication via telecommunications/telephony networks such as analog voice networks or digital fiber communications networks, via storage area networks such as Fibre Channel SANs, or via any other suitable type of network and/or protocol.

In some embodiments, system memory 1220 may be one embodiment of a computer-accessible medium configured to store program instructions and data for implementing embodiments of control methods as described above relative to FIGS. 1-11. In other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computer system 1200 via I/O interface 1230. A non-transitory computer-accessible storage medium may also include any volatile or non-volatile media such as RAM (e.g. SDRAM, DDR SDRAM, RDRAM, SRAM, etc.), ROM, etc., that may be included in some embodiments of computer system 1200 as system memory 1220 or another type of memory. Further, a computer-accessible medium may include transmission media or signals such as electrical, electromagnetic, or digital signals, conveyed via a communication medium such as a network and/or a wireless link, such as may be implemented via network interface 1240.

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
   a plurality of rack computer systems, wherein each rack computer system comprises:
   a plurality of mass storage devices coupled to at least one power distribution system and configured to consume electrical power supplied by the at least one power distribution system;
   a plurality of power sensors configured to measure individual electrical power consumption by individual ones of the plurality of mass storage devices; and
   a power monitoring system communicatively coupled to the plurality of power sensors, wherein the power monitoring system is configured to:
   determine, based at least in part upon processing measurement data received from a particular one of the plurality of power sensors, a corresponding operating temperature of a particular one of the mass storage devices; and
   responsive to a determination based at least in part on the measurement data that the operating temperature of the particular mass storage device at least meets a threshold temperature value, limit data migration to the particular mass storage device.

2. The data center of claim 1, wherein the power monitoring system is configured to adjust a respective operating state of one or more web services configured to implement data migration between some of the mass storage devices, such that each mass storage device, of the plurality of mass storage devices, is configured to perform computing operations based at least in part upon data migration to the respective mass storage device commanded by at least one web service.

3. The data center of claim 2, wherein the operating state of each web service comprises a restriction on data migration to the particular mass storage device, wherein the power monitoring system is configured to:
   generate at least one data migration command which, when transmitted to at least one web service, causes the at least one web service to at least partially restrict data migration to the particular mass storage device, such that at least one instance of data is restricted from being migrated to the particular mass storage device from another mass storage device of the plurality of mass storage devices.

4. The data center of claim 1, wherein responsive to the determination that the operating temperature of the particular mass storage device at least meets the threshold temperature value, the power monitoring system is operable to generate a command to restrict the data migration to the particular storage device to data packets that are less than a particular packet size.

5. The data center of claim 1, wherein responsive to the determination that the operating temperature of the particular mass storage device at least meets the threshold temperature value, the power monitoring system is operable to generate a command to restrict all data migrations to the particular mass storage device.

6. The data center of claim 1, wherein responsive to the determination that the operating temperature of the particular mass storage device at least meets the threshold temperature value, the power monitoring system is operable to generate a command to migrate data away from the particular mass storage device.

7. The data center of claim 1, wherein responsive to the operating temperature of the particular mass storage device being reduced below the threshold temperature value as a result of the limitation of the data migration to the particular mass storage device, the power monitoring system is operable to generate a command to increase data migration to the particular mass storage device to optimize storage device utilization.

8. A system, comprising:
   a power monitoring system, implemented on at least one computer system, which is configured to manage operating temperatures of one or more mass storage devices of a plurality of mass storage devices installed in one or more rack computer systems, wherein, to manage operating temperatures of the one or more mass storage devices, the power monitoring system is configured to:
   receive power data associated with electrical power consumed by a particular mass storage device of the one or more mass storage devices, the power data generated by one or more sensor devices installed in one of the one or more rack computer systems;

determine an operating temperature of a particular one of the mass storage devices, of the plurality of mass storage devices, based at least in part upon the received power data; and responsive to a determination that the operating temperature of the particular mass storage device meets a threshold value, limit data migration to the particular mass storage device.

9. The system of claim 8, wherein the power monitoring system is configured to adjust a respective operating state of one or more web services configured to implement data migration between some of the mass storage devices, such that each mass storage device, of the plurality of mass storage devices, is configured to perform computing operations based at least in part upon data migration to the respective mass storage device commanded by at least one web service.

10. The system of claim 9, wherein the operating state of each web service comprises a restriction on data migration to the particular mass storage device, wherein the power monitoring system is configured to:

generate at least one data migration command which, when transmitted to at least one web service, causes the at least one web service to at least partially restrict data migration to the particular mass storage device, such that at least one instance of data is restricted from being migrated to the particular mass storage device from another mass storage device of the plurality of mass storage devices.

11. The system of claim 8, wherein responsive to the determination that the operating temperature of the particular mass storage device at least meets the threshold temperature value, the power monitoring system is operable to generate a command to restrict the data migration to the particular storage device to data packets that are less than a particular packet size.

12. The system of claim 8, wherein responsive to the determination that the operating temperature of the particular mass storage device at least meets the threshold temperature value, the power monitoring system is operable to generate a command to restrict all data migrations to the particular mass storage device.

13. The system of claim 8, wherein responsive to the determination that the operating temperature of the particular mass storage device at least meets the threshold temperature value, the power monitoring system is operable to generate a command to migrate data away from the particular mass storage device.

14. The system of claim 8, wherein responsive to the operating temperature of the particular mass storage device being reduced below the threshold temperature value as a result of the limitation of the data migration to the particular mass storage device, the power monitoring system is operable to generate a command to increase data migration to the particular mass storage device to optimize storage device utilization.

15. A method, comprising:
performing, by one or more computer systems:
determining an operating temperature of a particular mass storage device of a plurality of mass storage devices, based at least in part upon power data associated with electrical power consumed by the particular mass storage device, the power data generated by one or more power sensors; and
responsive to a determination based at least in part on the power data that the operating temperature of the particular mass storage device at least meets a particular threshold temperature value, limiting data migration to the particular mass storage device.

16. The method of claim 15, further comprising adjusting a respective operating state of one or more web services configured to implement data migration between some of the mass storage devices, such that each mass storage device, of the plurality of mass storage devices, is configured to perform computing operations based at least in part upon data migration to the respective mass storage device commanded by at least one web service.

17. The method of claim 15, wherein limiting data migration comprises generating a command to restrict the data migration to the particular storage device to data packets that are less than a particular packet size.

18. The method of claim 15, wherein limiting data migration comprises generating a command to restrict all data migrations to the particular mass storage device.

19. The method of claim 15, wherein limiting data migration comprises generating a command to migrate data away from the particular mass storage device.

20. The method of claim 15, further comprising responsive to the operating temperature of the particular mass storage device being reduced below the threshold temperature value as a result of the limitation of the data migration to the particular mass storage device, generating a command to increase data migration to the particular mass storage device to optimize storage device utilization.

\* \* \* \* \*